United States Patent
Zainuddin et al.

(10) Patent No.: US 12,346,578 B2
(45) Date of Patent: Jul. 1, 2025

(54) DISTRIBUTED TEMPERATURE SENSING SCHEME TO SUPPRESS PEAK Icc IN NON-VOLATILE MEMORIES

(71) Applicant: Western Digital Technologies, Inc., San Jose, CA (US)

(72) Inventors: Abu Naser Zainuddin, Milpitas, CA (US); Jiahui Yuan, Fremont, CA (US); Sai Gautham Thoppa, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 166 days.

(21) Appl. No.: 18/359,025

(22) Filed: Jul. 26, 2023

(65) Prior Publication Data

US 2024/0427502 A1 Dec. 26, 2024

Related U.S. Application Data

(60) Provisional application No. 63/510,334, filed on Jun. 26, 2023.

(51) Int. Cl.
*G11C 7/04* (2006.01)
*G06F 3/06* (2006.01)

(52) U.S. Cl.
CPC .......... *G06F 3/0625* (2013.01); *G06F 3/0653* (2013.01); *G06F 3/0659* (2013.01); *G06F 3/0679* (2013.01); *G11C 7/04* (2013.01)

(58) Field of Classification Search
CPC .... G06F 3/0625; G06F 3/0653; G06F 3/0659; G06F 3/0679; G06F 3/0634; G06F 3/061; G11C 7/04; G11C 11/5628; G11C 11/5642; G11C 16/0483; G11C 16/08; G11C 16/10; G11C 16/26; G11C 16/32; G11C 16/3418; G11C 16/3459
USPC ............................................. 365/211, 230.06
See application file for complete search history.

(56) References Cited

U.S. PATENT DOCUMENTS

| | | | |
|---|---|---|---|
| 7,463,528 B2 | 12/2008 | Mokhlesi et al. | |
| 7,583,539 B2 | 9/2009 | Sekar et al. | |
| 7,755,946 B2 | 7/2010 | Dunga et al. | |
| 9,224,457 B2 | 12/2015 | Hemink et al. | |

(Continued)

OTHER PUBLICATIONS

International Search Report & The Written Opinion of the International Searching Authority dated May 14, 2024, International Application No. PCT/US2024/012044.

*Primary Examiner* — Michael T Tran
(74) *Attorney, Agent, or Firm* — Pearl Cohen Zedek Latzer Baratz LLP

(57) ABSTRACT

To reduce Icc spikes during the operation of a non-volatile memory device, a distributed temperature sensing system individually monitors each plane of a memory die during memory operations. Icc levels during a memory operation are temperature dependent. By monitoring the temperature of the individual memory planes during an operation, the bias levels for performing the operation can be changed during the course of that operation in order to reduce Icc spikes during the operation. For example, during a write operation if the temperature increase of a plane exceeds a threshold during earlier programming loops, the bias conditions, such as word line or bit line bias voltages, can be altered for later programming loops of the write operation.

20 Claims, 30 Drawing Sheets

(56) References Cited

U.S. PATENT DOCUMENTS

| | | | |
|---|---|---|---|
| 9,355,024 B2* | 5/2016 | Nguyen | G06F 1/206 |
| 9,543,028 B2 | 1/2017 | Ray et al. | |
| 2004/0112138 A1* | 6/2004 | Knirck | G01L 1/205 |
| | | | 73/754 |
| 2005/0104566 A1 | 5/2005 | Kim | |
| 2012/0029724 A1 | 11/2012 | Jeddeloh | |
| 2014/0021155 A1 | 7/2014 | Ferre-Rangel et al. | |
| 2014/0266269 A1* | 9/2014 | Ausserlechner | G01R 1/203 |
| | | | 324/713 |
| 2015/0310938 A1 | 10/2015 | Kim et al. | |
| 2016/0162219 A1* | 6/2016 | Erez | G11C 7/04 |
| | | | 711/103 |
| 2017/0092558 A1* | 3/2017 | Mittal | H01L 25/0657 |
| 2017/0176260 A1* | 6/2017 | Ferguson | H01L 24/81 |
| 2018/0058943 A1* | 3/2018 | Ge | H01L 23/5228 |
| 2020/0294884 A1* | 9/2020 | Shaikh | H01L 23/38 |
| 2022/0293183 A1 | 9/2022 | Padilla | |
| 2022/0406364 A1* | 12/2022 | Yabe | H10B 43/27 |
| 2022/0406383 A1 | 12/2022 | Chin et al. | |
| 2022/0413699 A1* | 12/2022 | Luo | G06F 11/07 |
| 2022/0413761 A1* | 12/2022 | Masuduzzaman | G06F 3/0659 |
| 2022/0415401 A1* | 12/2022 | Park | G06F 3/0659 |
| 2023/0128914 A1* | 4/2023 | Rehmeyer | G06F 1/24 |
| | | | 711/105 |
| 2023/0266909 A1* | 8/2023 | Kale | G06F 3/0604 |

\* cited by examiner

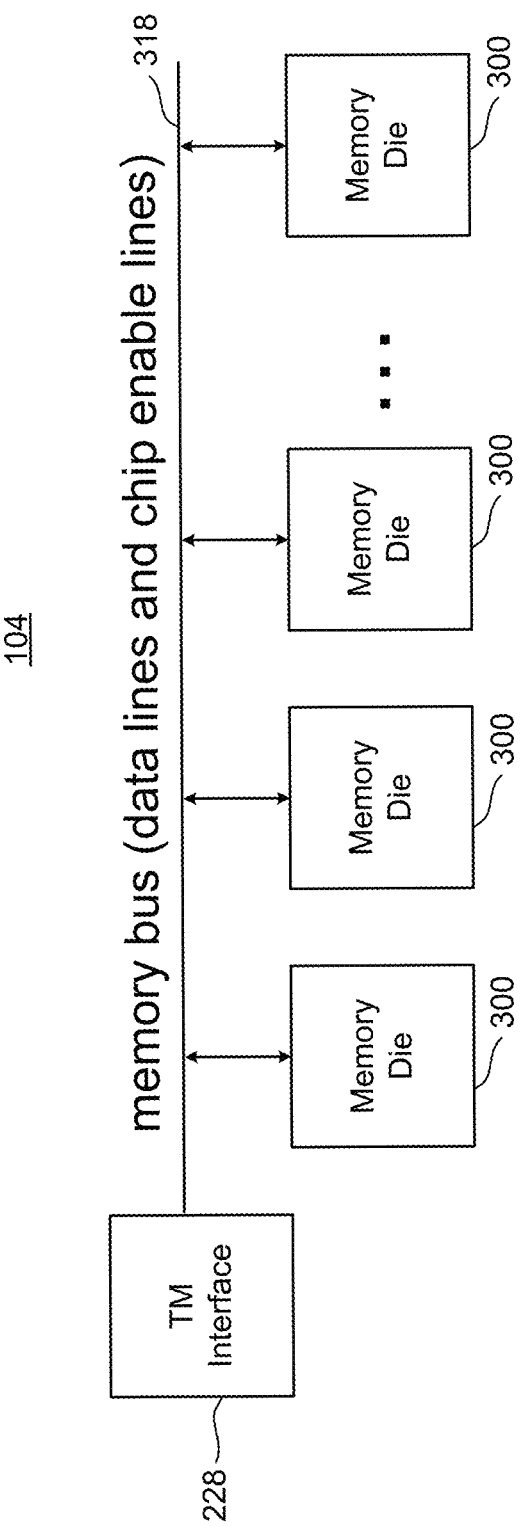

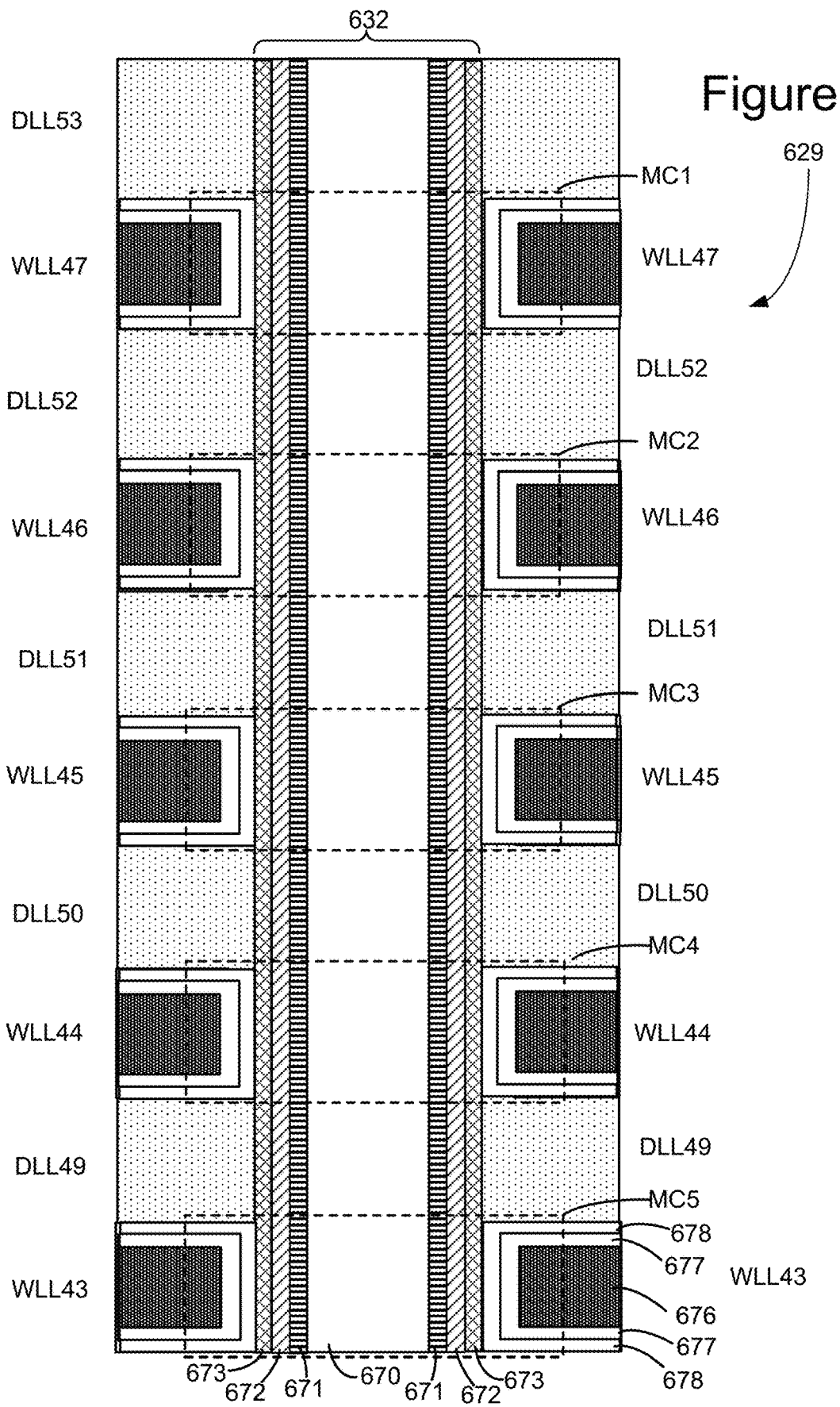

Figure 7A
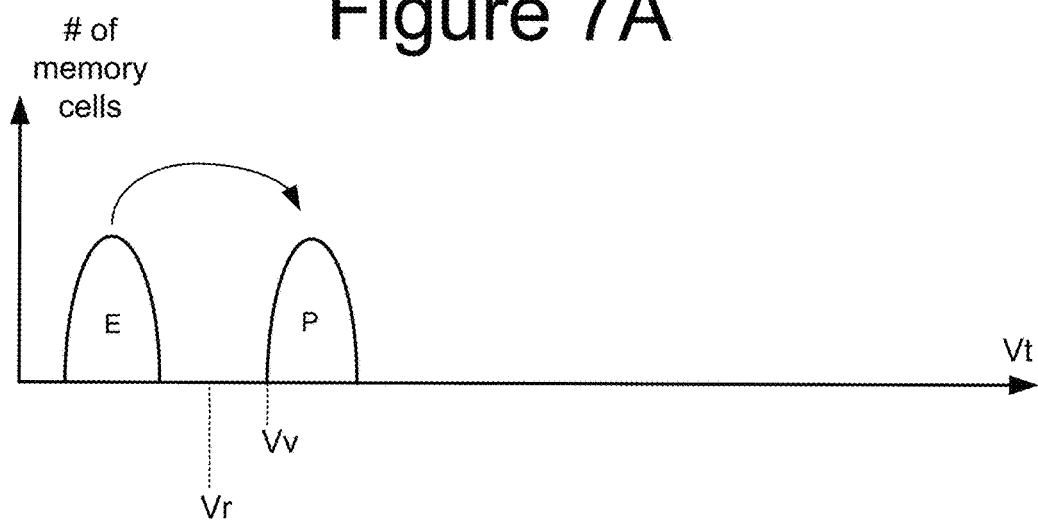
Figure 7B
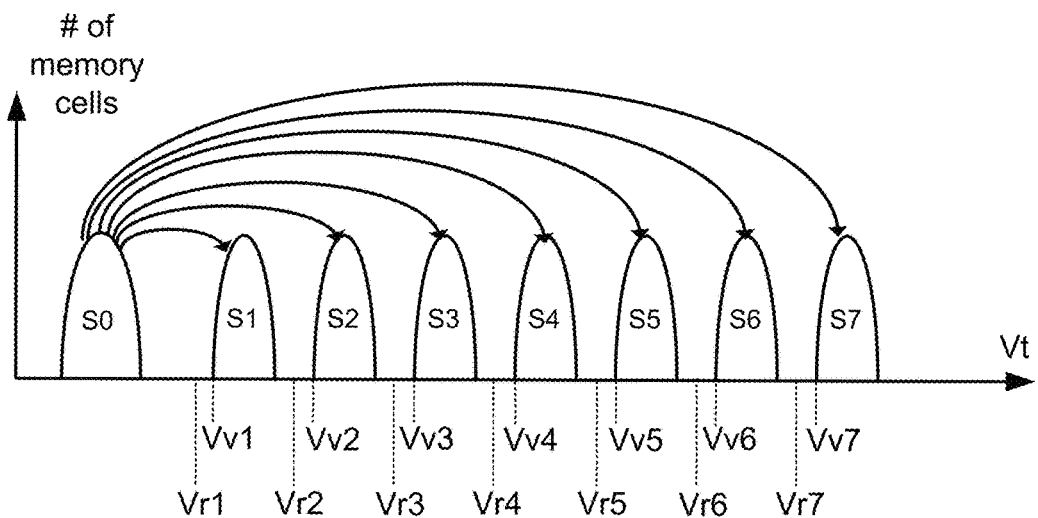
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

DISTRIBUTED TEMPERATURE SENSING SCHEME TO SUPPRESS PEAK Icc IN NON-VOLATILE MEMORIES

CLAIM OF PRIORITY

The present application claims priority from U.S. Provisional Patent Application No. 63/510,334, entitled "DISTRIBUTED TEMPERATURE SENSING SCHEME TO SUPPRESS PEAK ICC IN NON-VOLATILE MEMORIES," by Zainuddin et al., filed Jun. 26, 2023, incorporated by reference herein in its entirety.

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed, but also want the memory to consume less power.

BRIEF DESCRIPTION OF THE DRAWINGS

Like-numbered elements refer to common components in the different figures.

FIG. 2B is a block diagram of one embodiment of a memory package.

FIG. 6E depicts a cross sectional view of region of FIG. 6D that includes a portion of a vertical column.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

DETAILED DESCRIPTION

Figure 1A:
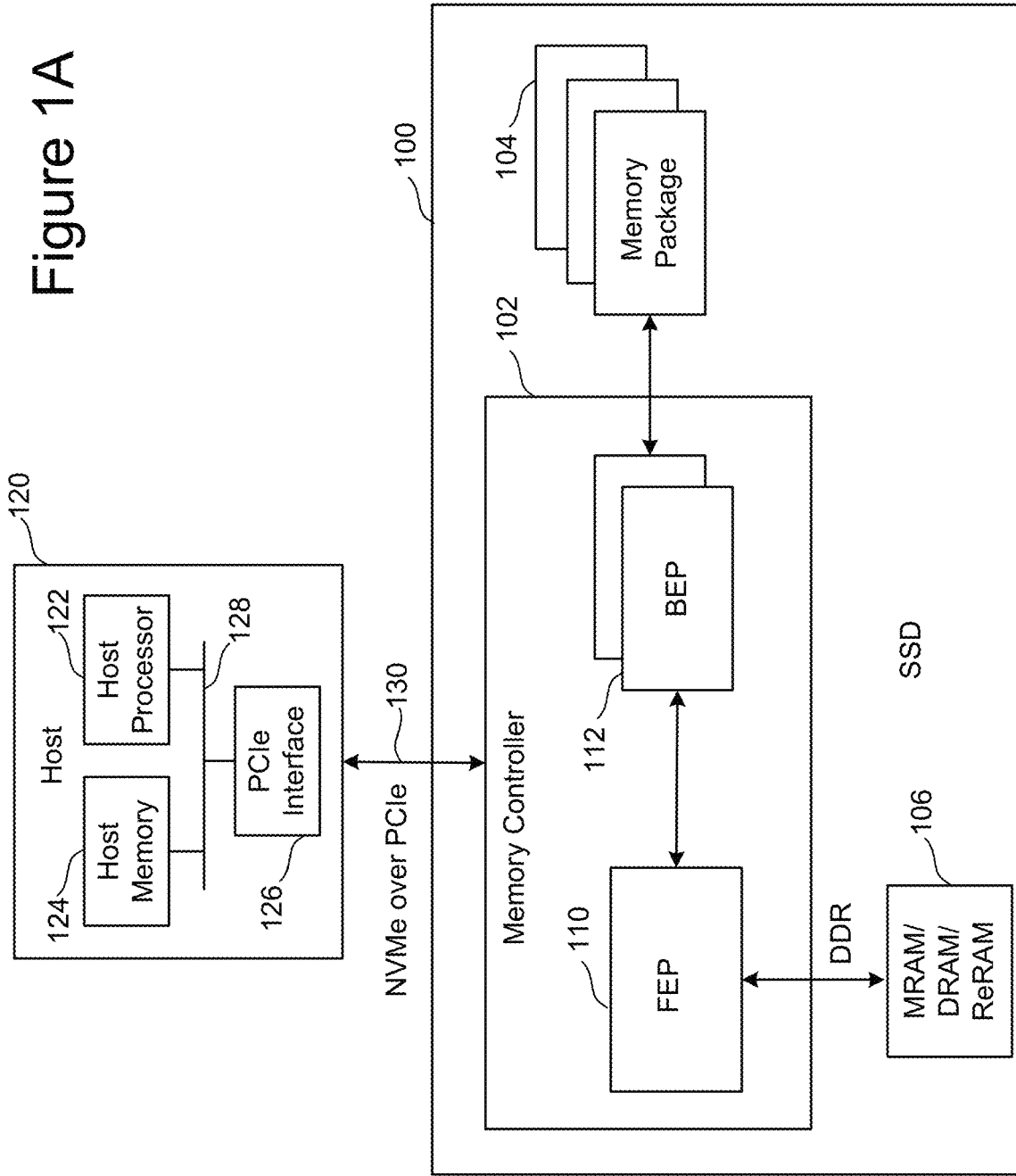
FIG. 1A is a block diagram of one embodiment of a storage system connected to a host.

In a NAND and other types of non-volatile memory, the current Icc used by a memory varies depending on the operation being performed. This can result in relatively large Icc spikes during certain operations. For example, in NAND memory during a read or write along a selected word line of a memory block, the non-selected word lines need to be charged up to a relatively high voltage level, such as an unselected word line read bypass voltage Vread or a write bypass voltage Vpass. Generating these voltages typically use a charge pump to generate these voltages for a large number of unselected word lines, resulting in a large Icc spike. To increase performance, multiple memory dies are typically operated in parallel. While this increases performance, it can result in the Icc spikes from the multiple dies aligning, leading to very large cumulative Icc spikes for the system.

To reduce these spikes, relative delays between the dies operated in parallel can be added at certain points in an operation. For example, when issuing commands for a memory operation to multiple memory dies operated in parallel, a memory controller can introduce differing amount of delay for the different memory dies before executing high Icc sub-operations of the command. Where the primary Icc peak occurs in a particular memory operation can depend upon the extent to which a selected memory block is programmed. For example, when reading a block of NAND memory that is programmed (a closed block), the primary Icc peak occurs when ramping up the unselected word lines to the read bypass voltage Vread, while for a block in which the memory cells are in, or mostly, in an erased state (an open), the primary read Icc peak occurs when the bit lines are charged up. To account for these differences, the following introduces techniques for managing Icc peaks by, when performing a sensing operation, determining the extent to which the memory block is already programmed and, based on this extent, determining where to introduce relative delays. For example, if a block fully or largely closed, delays are introduced before ramping up the unselected word lines, but otherwise adding the delays before charging up bit lines.

In further embodiments to reduce Icc spikes, a distributed temperature sensing system individually monitors each plane of a memory die during memory operations. Icc levels during a memory operation are temperature dependent. By monitoring the temperature of the individual memory planes during an operation, the bias levels for performing the operation can be changed during the course of that operation in order to reduce Icc spikes during the operation. For example, during a write operation if the temperature increase of a plane exceeds a threshold during earlier programming loops, the bias conditions, such as word line or bit line bias voltages, can be altered for later programming loops of the write operation.

FIGS. 1A-6F describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
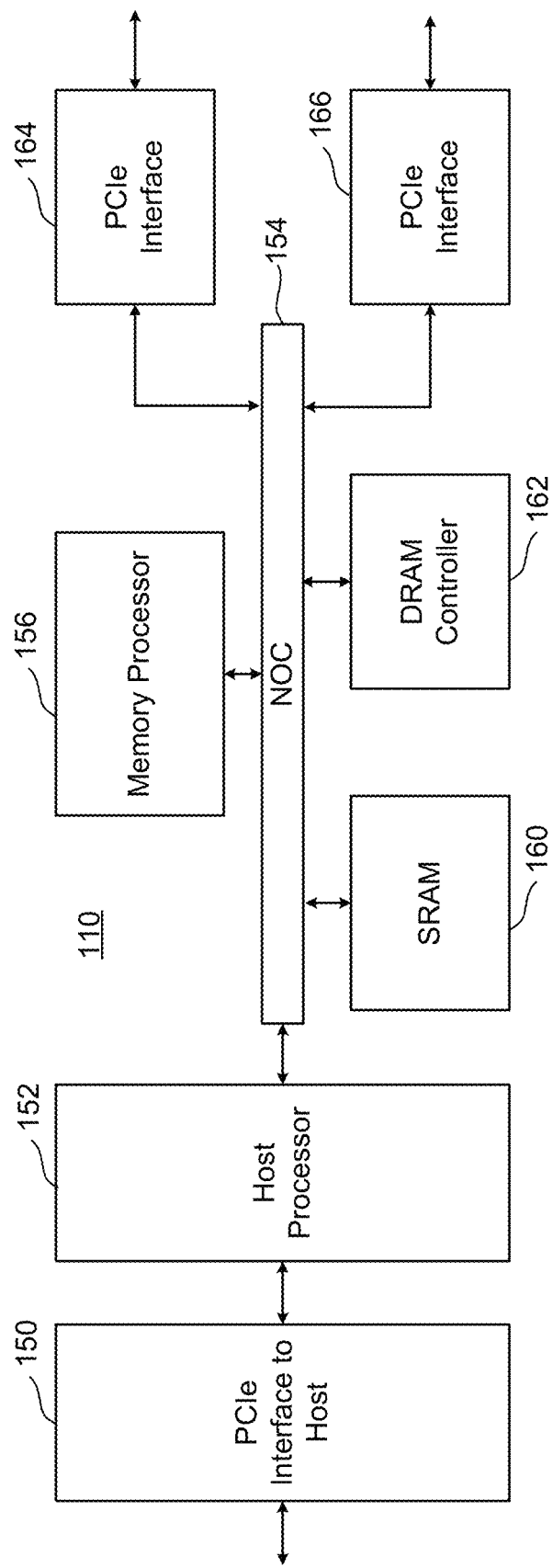
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
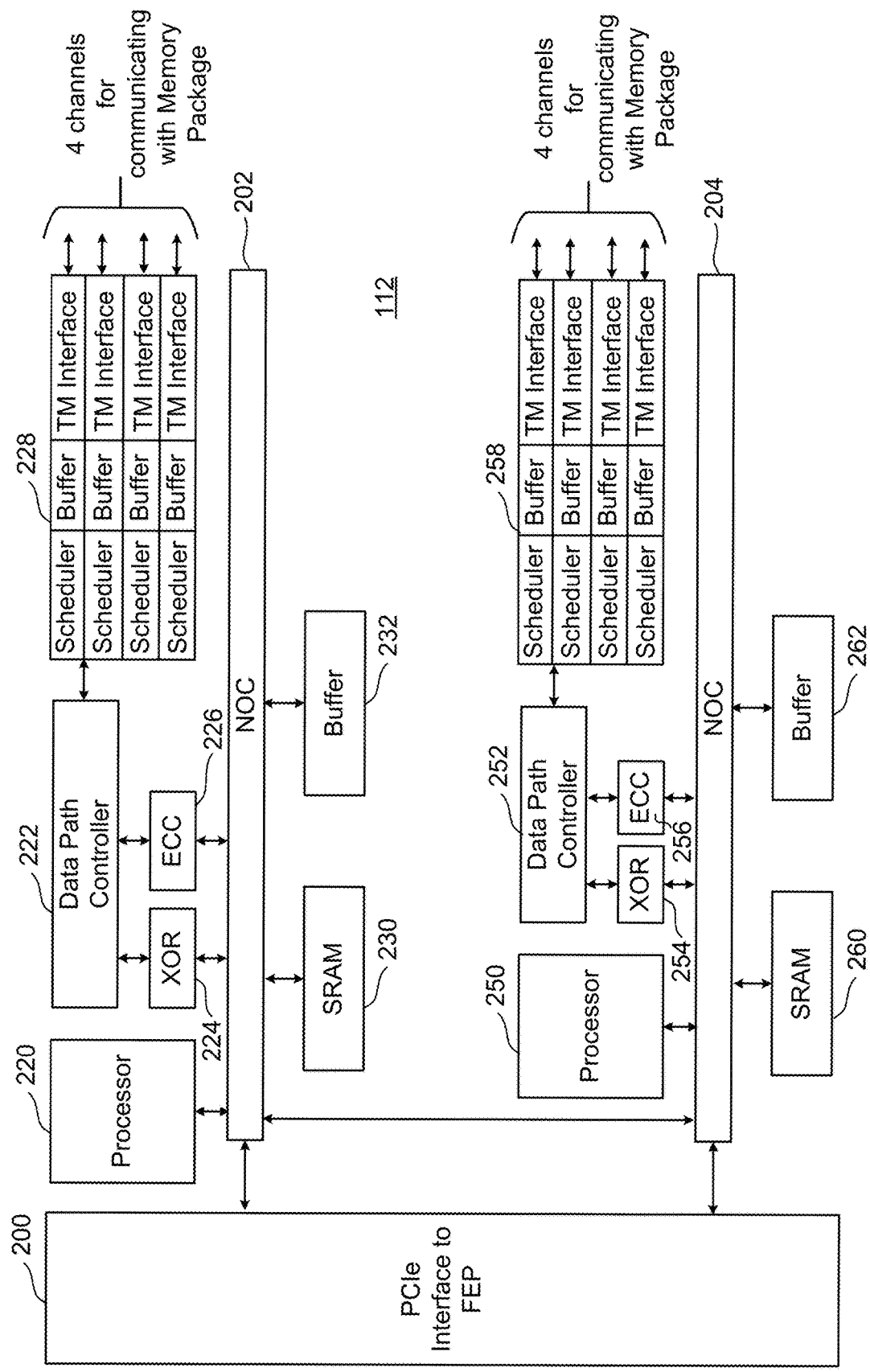
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
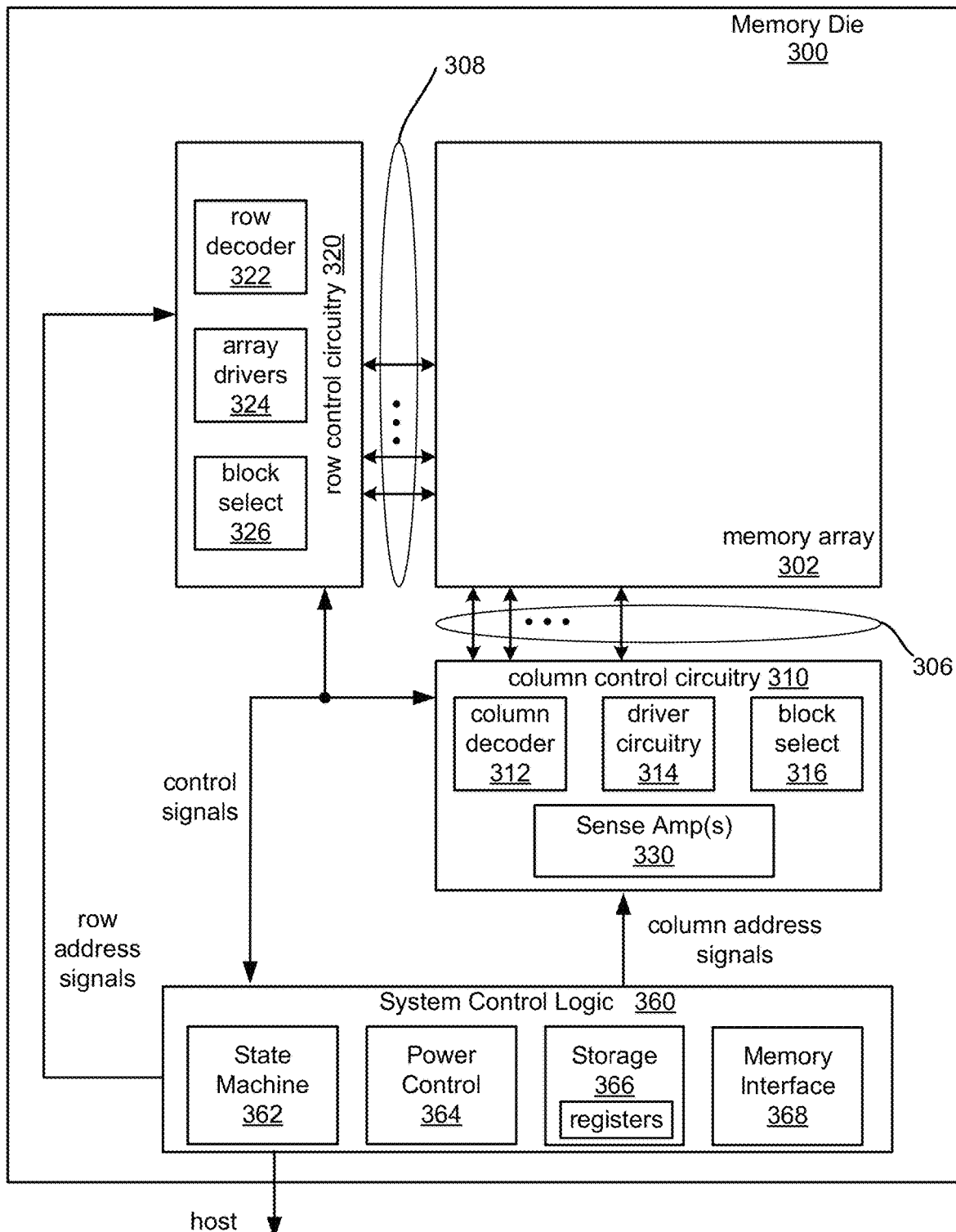
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only a single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
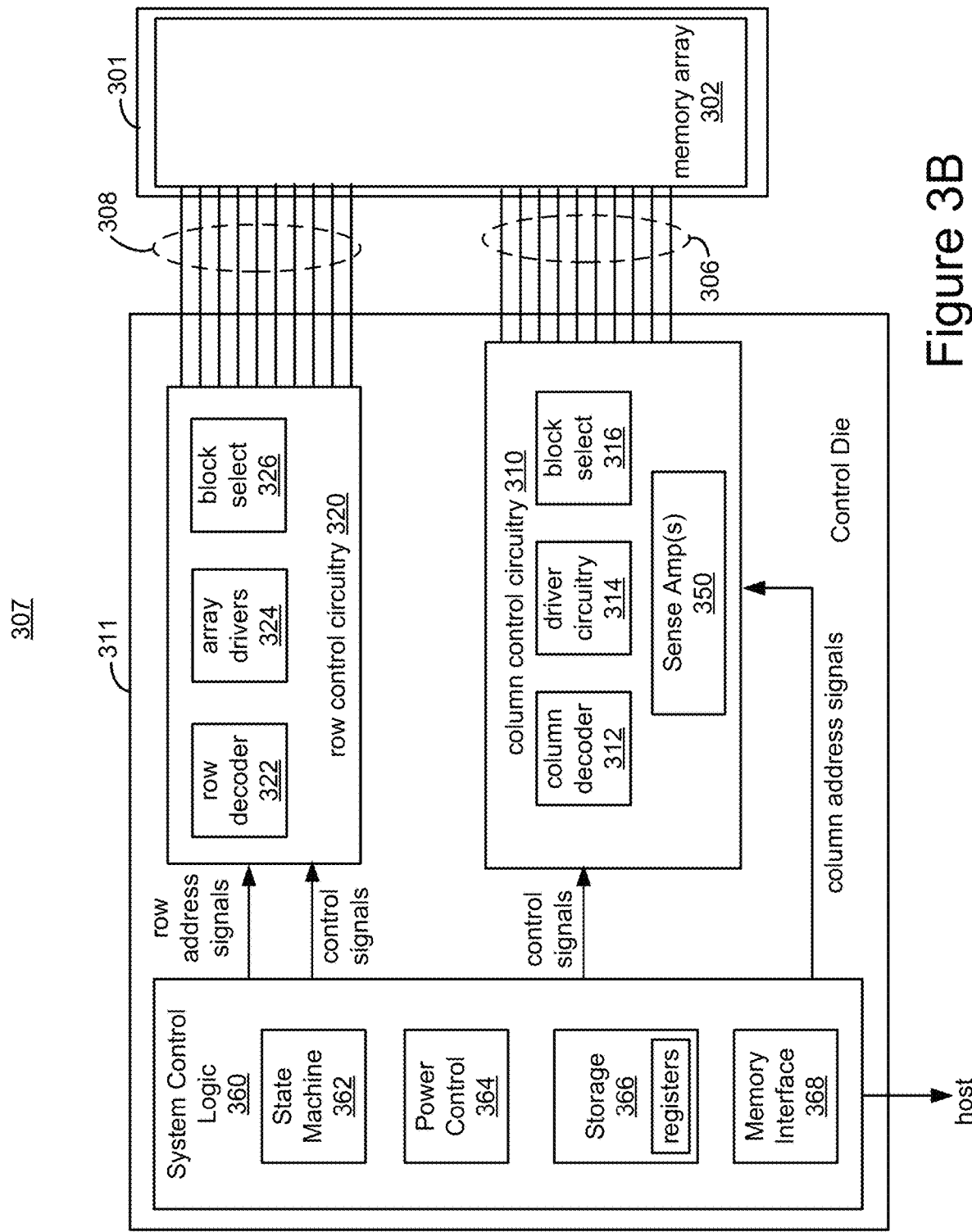
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4:
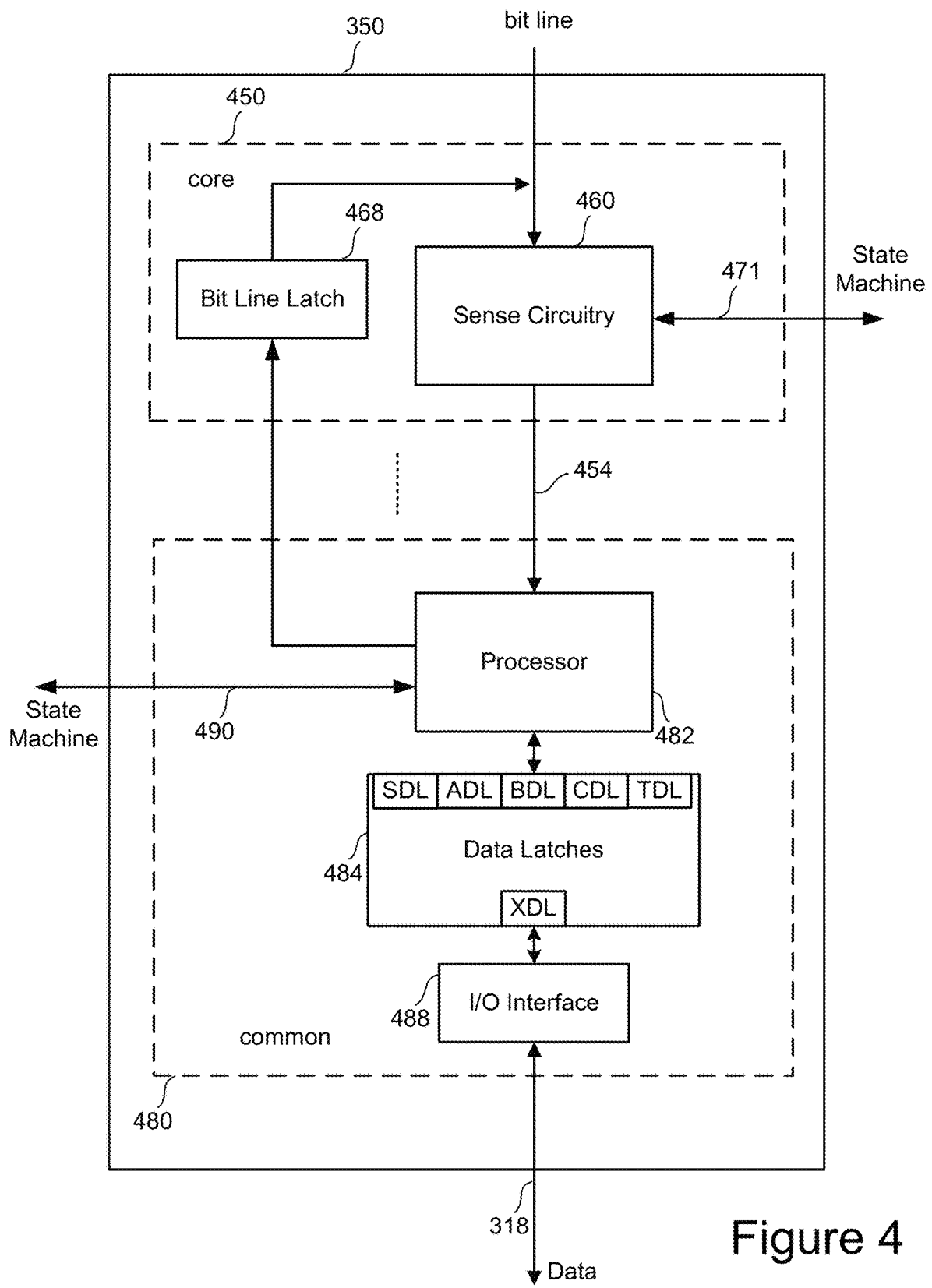
FIG. 4 is a block diagram of an individual sense block partitioned into a core portion and a common portion.

FIG. 4 is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to receive control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 468, a set of data latches 484 and an I/O Interface 488 coupled between the set of data latches 484 and data bus 318. Processor 468 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In a 2-bit per cell embodiment, only ADL and BDL might be used, while a 4-bit per cell MLC embodiment might include a further set of DDL latches. In other embodiments, the XDL latches can be used to hold additional pages of data, such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5A:
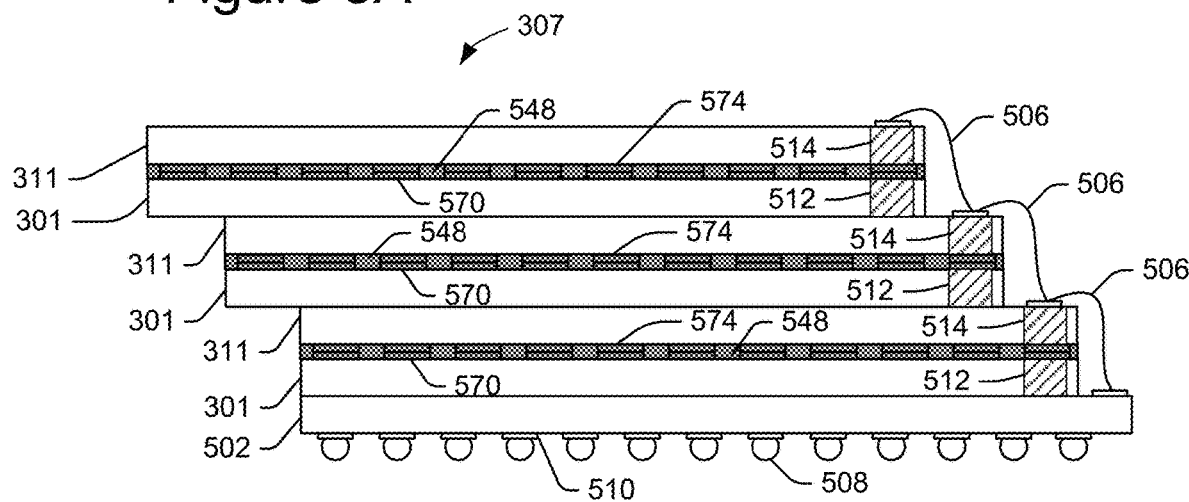
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
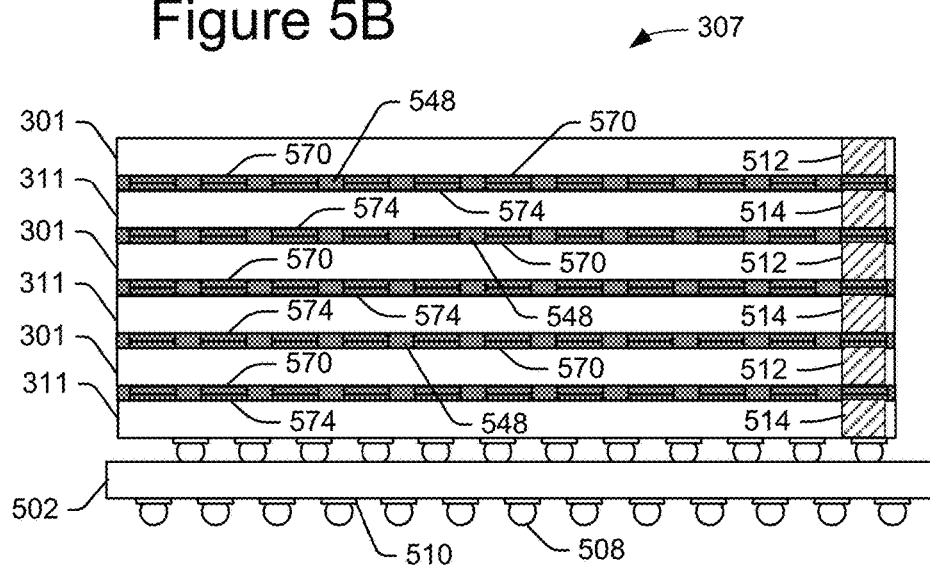
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
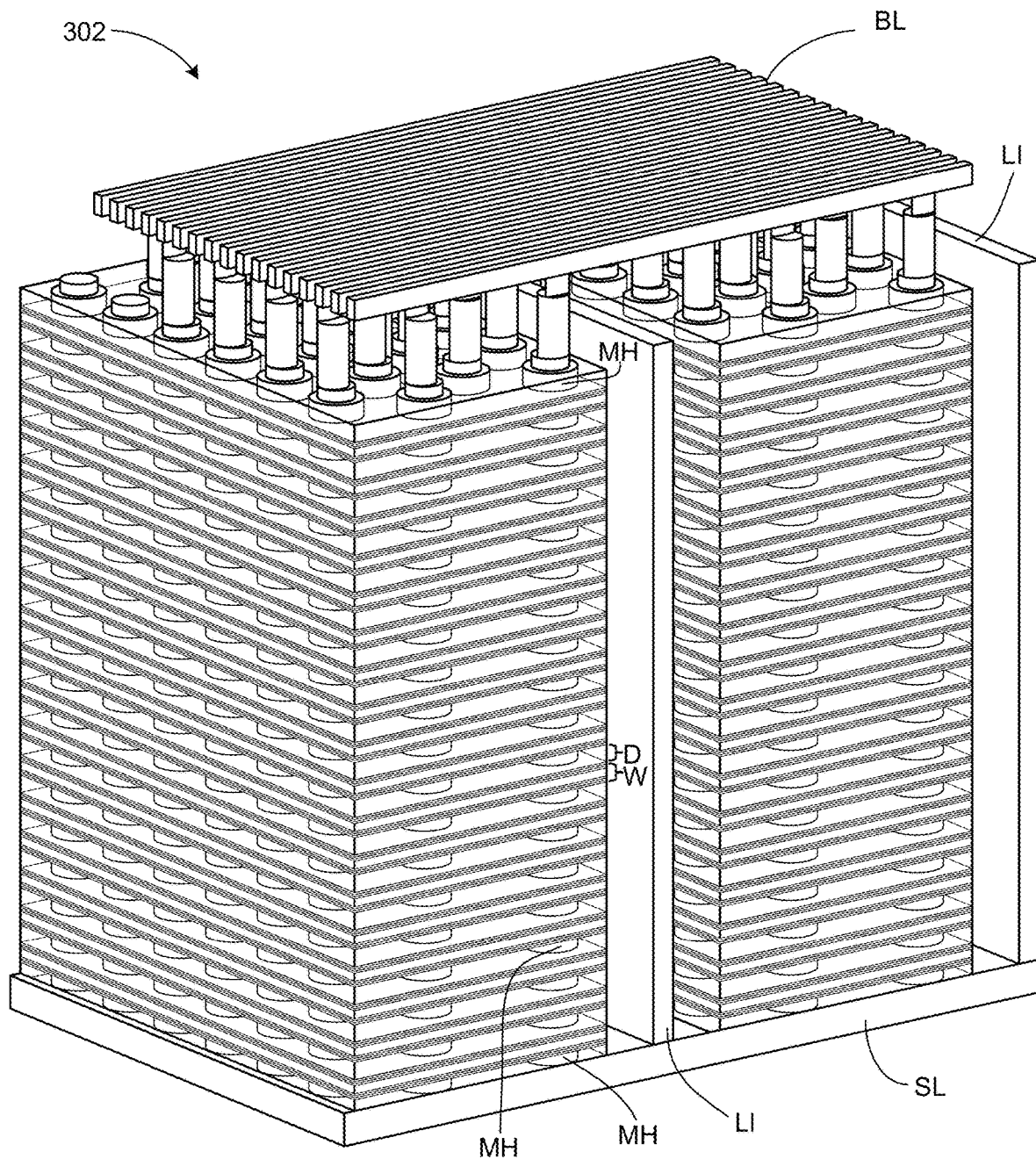
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
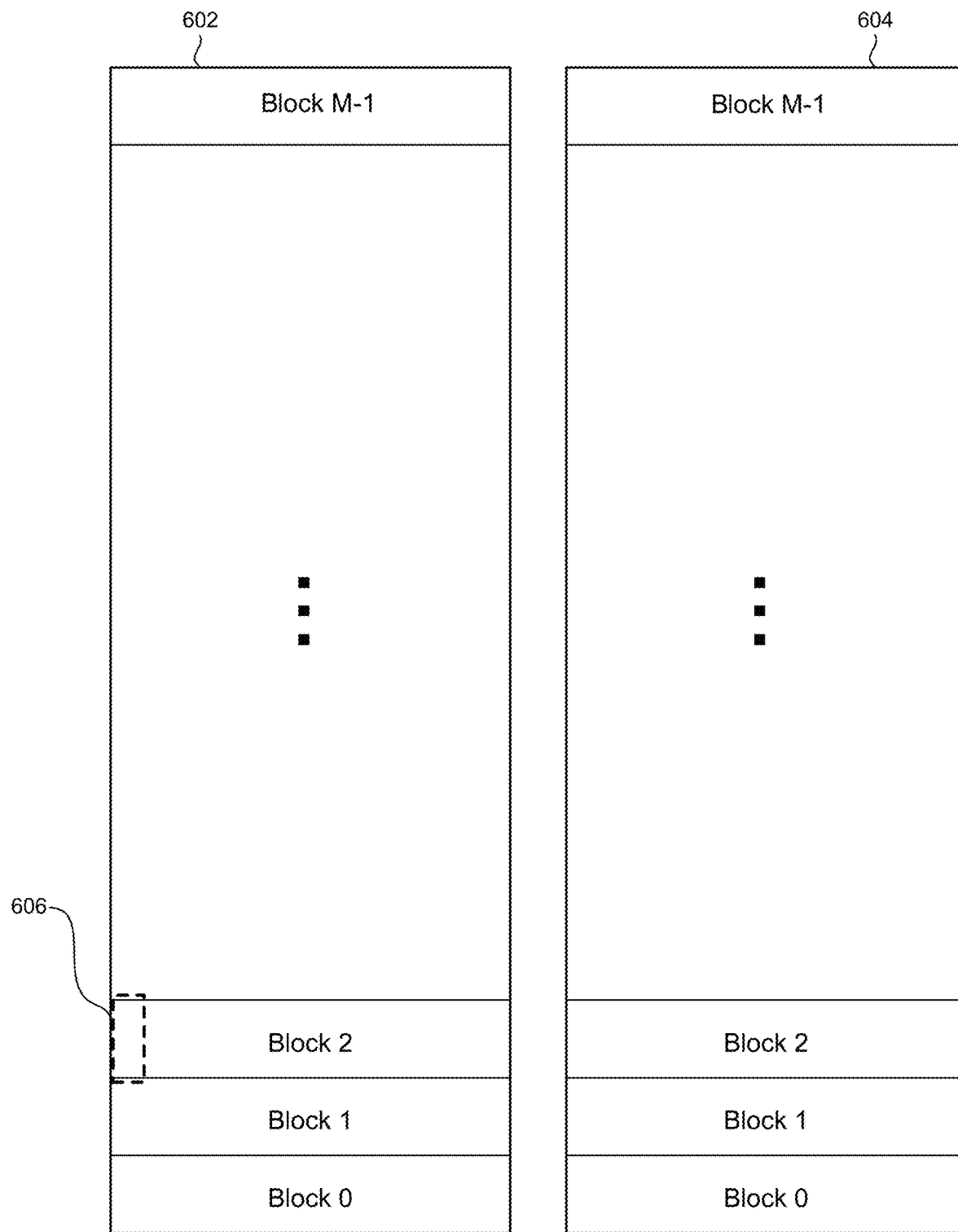
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
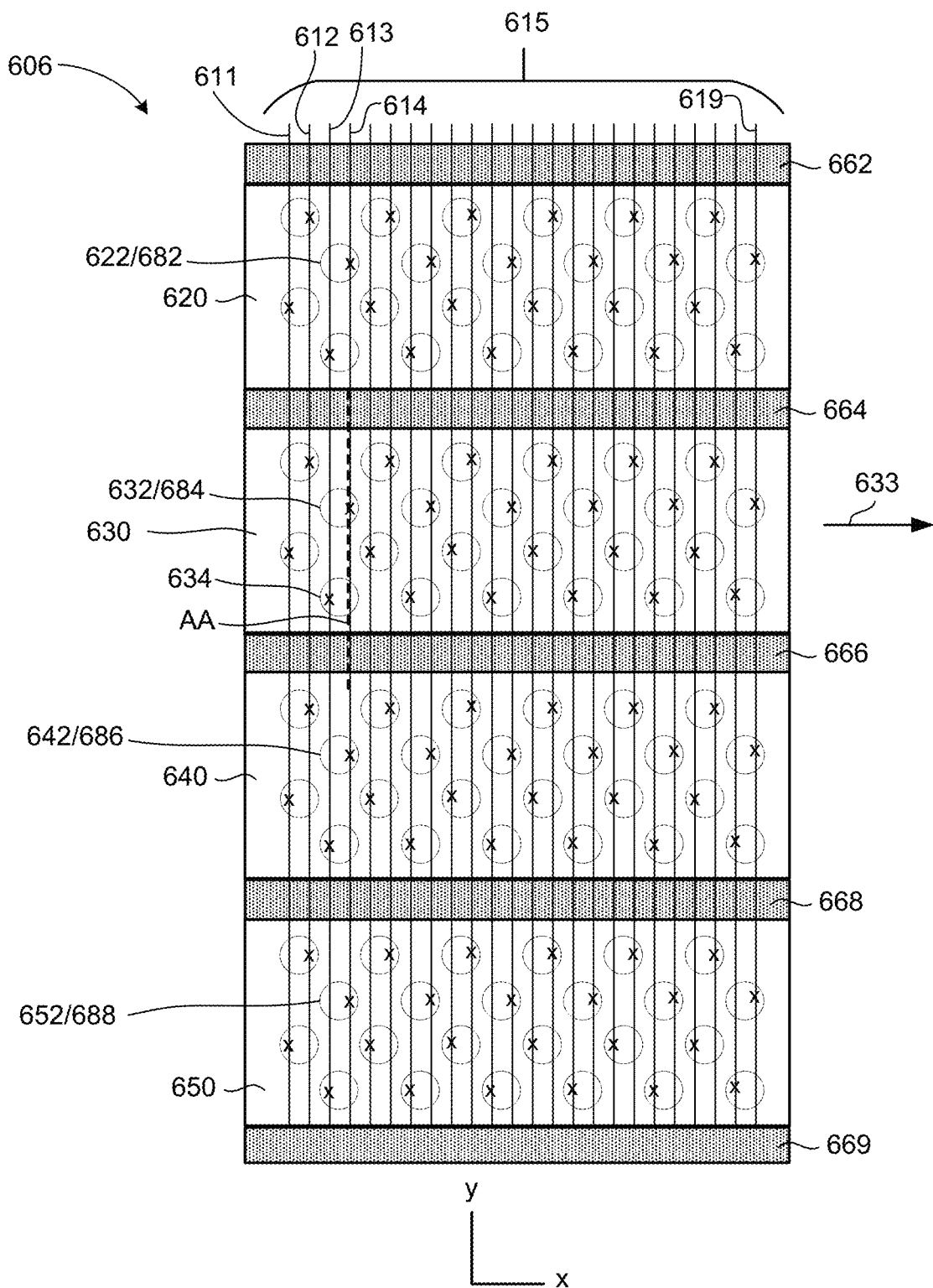
FIG. 6C is a block diagram depicting a top view of a portion of one block from the memory structure.
Figure 6D:
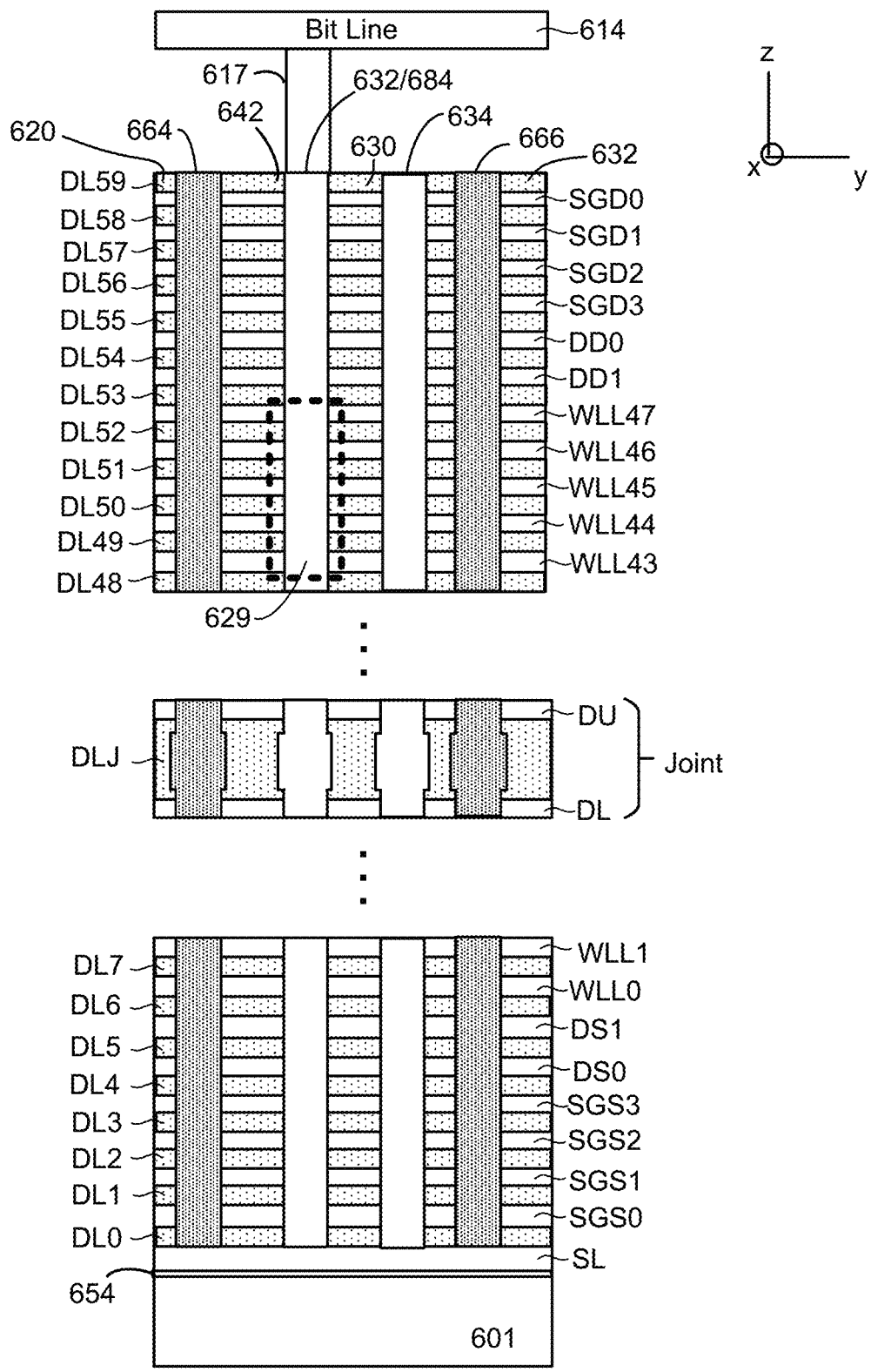
FIG. 6D depicts a portion of an embodiment of three dimensional memory structure showing a cross-sectional view along line AA of FIG. 6C.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns include multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together). Therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes: four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or fewer than four drain side select layers, more or fewer than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

For three dimensional NAND memory arrays having large numbers of word lines, one or more joint regions may be included. The use of a joint can simply the fabrication process and, in some embodiments, allow for sub-block level operations by accessing word lines only above or below the joint. The joint region will often have thicker dielectric region DLJ than between other word lines. As with the source and drain ends, one or more dummy word lines may be included above (DU) and below (DL) the joint.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as SiO$_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide (SiO$_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
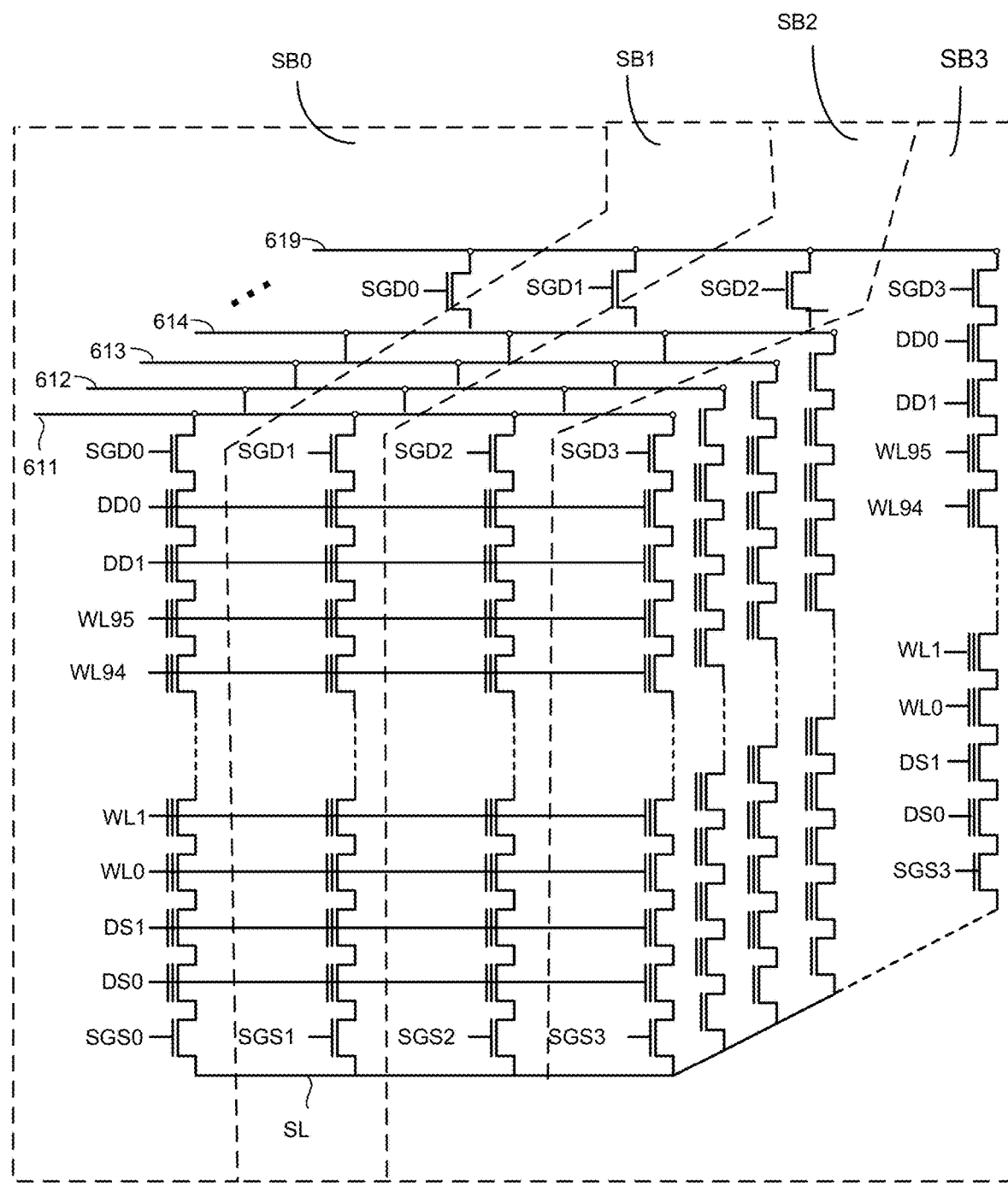
FIG. 6F is a schematic of a plurality of NAND strings showing multiple sub-blocks.

FIG. 6F is a schematic diagram of a portion of the memory depicted in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . , 619. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with memory controller 102 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
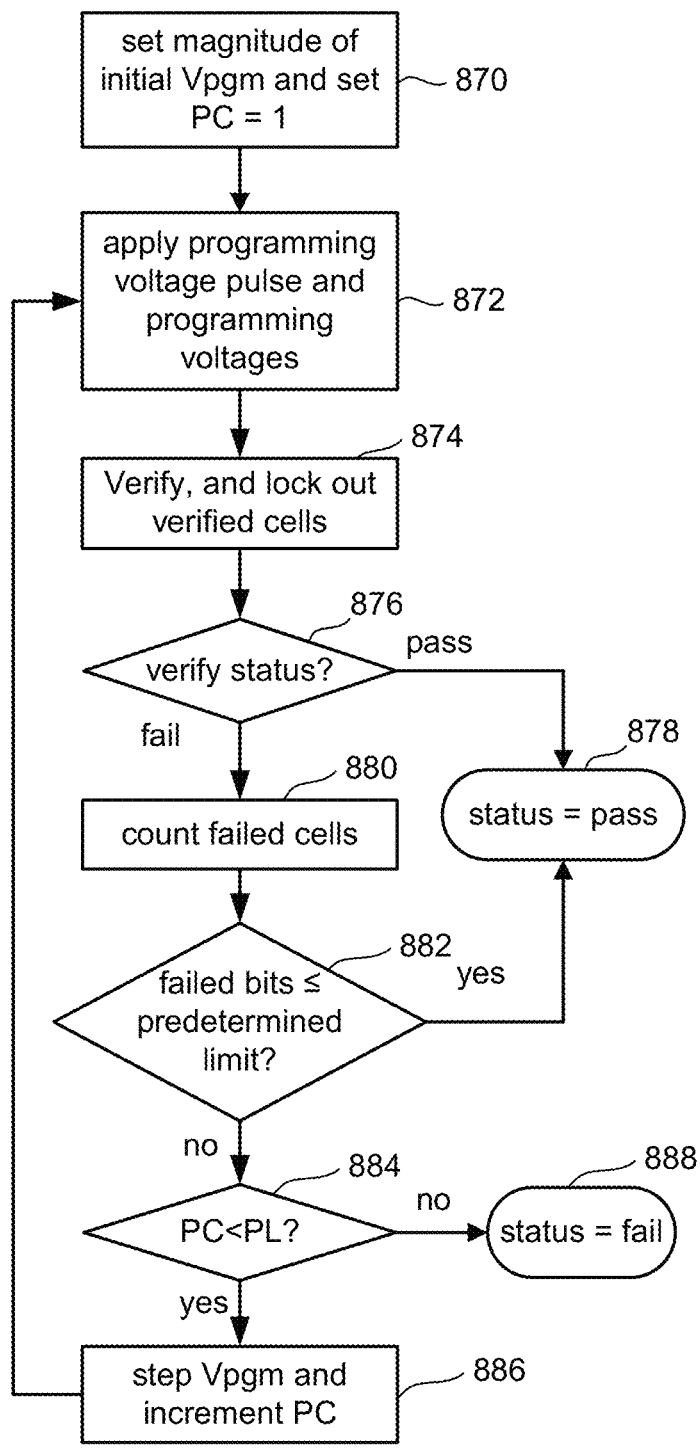
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
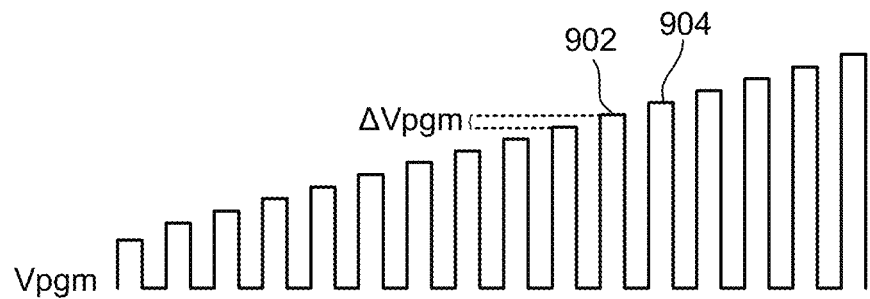
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells were programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
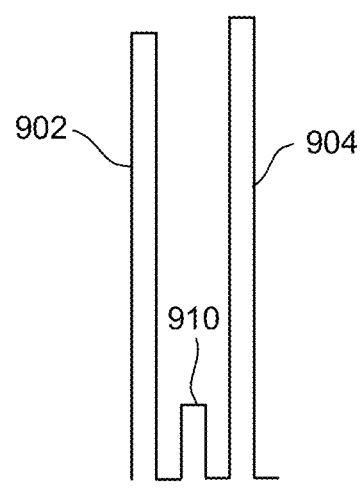
FIG. 10 depicts two programming voltage pulses and a verify voltage pulse.
Figure 11:
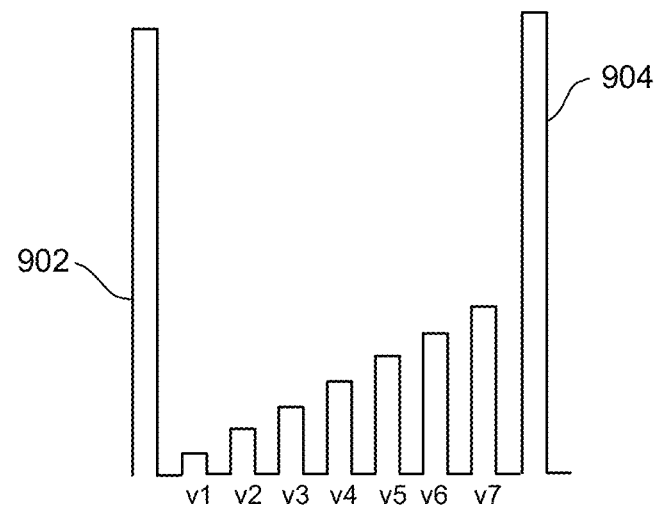
FIG. 11 depicts two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
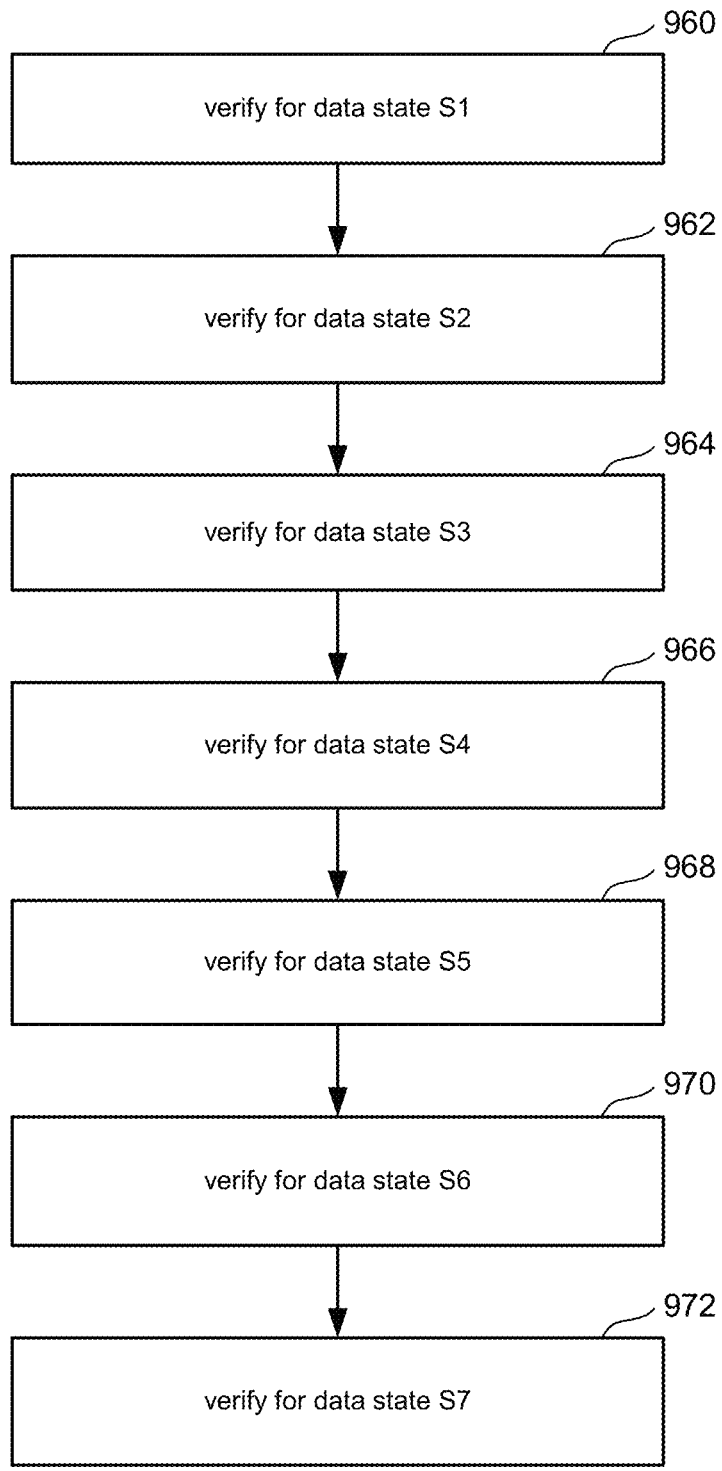
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vv1 (e.g., applying verify voltage pulse v1 of FIG. 11 to the control gates of memory cells being programmed to data state S1).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, and as the lower target data states begin to verify, additional higher data states are included; and, as the lower states finish, the lower target state verifies can be dropped out.

A program operation can include a single programming pass or multiple programming passes, where each pass uses incremental step pulse programming, for instance. The verify voltages in each program loop, including example verification signals v1-v7 in FIG. 11, can encompass lower assigned data states and then midrange assigned data states and then higher assigned data states as the program operations proceeds. FIG. 11 shows the use of all of v1-v7 between pulses 902 and 904, but in a smart verify operation usually only a subset is used. The verify voltages are part of a sensing operation. Memory cells are sensed during the application of the verification signal to judge their programming progress. A verify voltage is used to judge the programming progress of a memory cell.

Returning FIGS. 2A and 2B, the memory controller 102 includes a number of channels, each with an interface 228 through which it exchanges data with and issue commands to a number of memory die 300. To increase performance by increasing parallelism, these memory die 300 can be operated in parallel. For example, an SSD may operate eight memory die in parallel. Although this parallelism can improve performance, as multiple die may be performing the same operation, such as programming or a read, at the same time, the amount of current Icc drawn by the different dies will have similar profiles. In particular, current peaks from the dies can align, such that the cumulative Icc levels can result in large spikes in the amount of current being drawn. For example, when ramping unselected word lines for a read or program operation, a large number of world lines are currently ramped up to a relatively high voltage, leading to spike in the current Icc drawn by the die. When this is done concurrently across multiple die, the situation is exacerbated.

Focusing on the read process, the amount of current drawn and when this current is drawn can vary based on the state of the memory block where the read is being performed. For example, read Icc levels are found to be significantly higher for an Open Block (OB), where word lines have yet to be programmed and are the memory cells are in an erased state, compared to a Closed Block (CB), where all of the word lines have been written. For a fully open block (i.e., completely erased), average Icc levels can be around 2-2.5 times higher than for a fully closed block (i.e., all word lines written). Similarly, peak Icc levels for a fully open block can be around twice as high relative to a fully closed block. The location of the peak Icc in a read operation also differs between closed blocks and open blocks, where in a closed block the peak Icc is seen when ramping up the unselected word lines to the read bypass voltage Vread, while in an open block a larger peak is seen when the bit lines are ramped up.

One way to suppress these Icc peaks is to use a time division peak power management (TDPPM) mode in which the Icc peaks from the individual dies are offset or misaligned in time by inserting wait times before a given die executes a command with a large Icc peak, such that total peak current for the total package (say, an eight die package) is reduced as the peaks from the different dies do not align and add up vectorially. Typically, if enabled, this mode has only one check point in a read operation for handling Icc peaks by timing offsets. However, as it is found that read peak Icc position depends on the open-ness of block, with closed and open blocks having different Icc peak positions in the read process, the following introduces embodiments for separating the peak Icc check points between open and closed blocks in order to better suppress the dominant Icc peaks for the different situations. Although the following discussion focusses on the data read process, it can similarly be applied to other sensing operations, such as program verify or erase verify.

Figure 13:
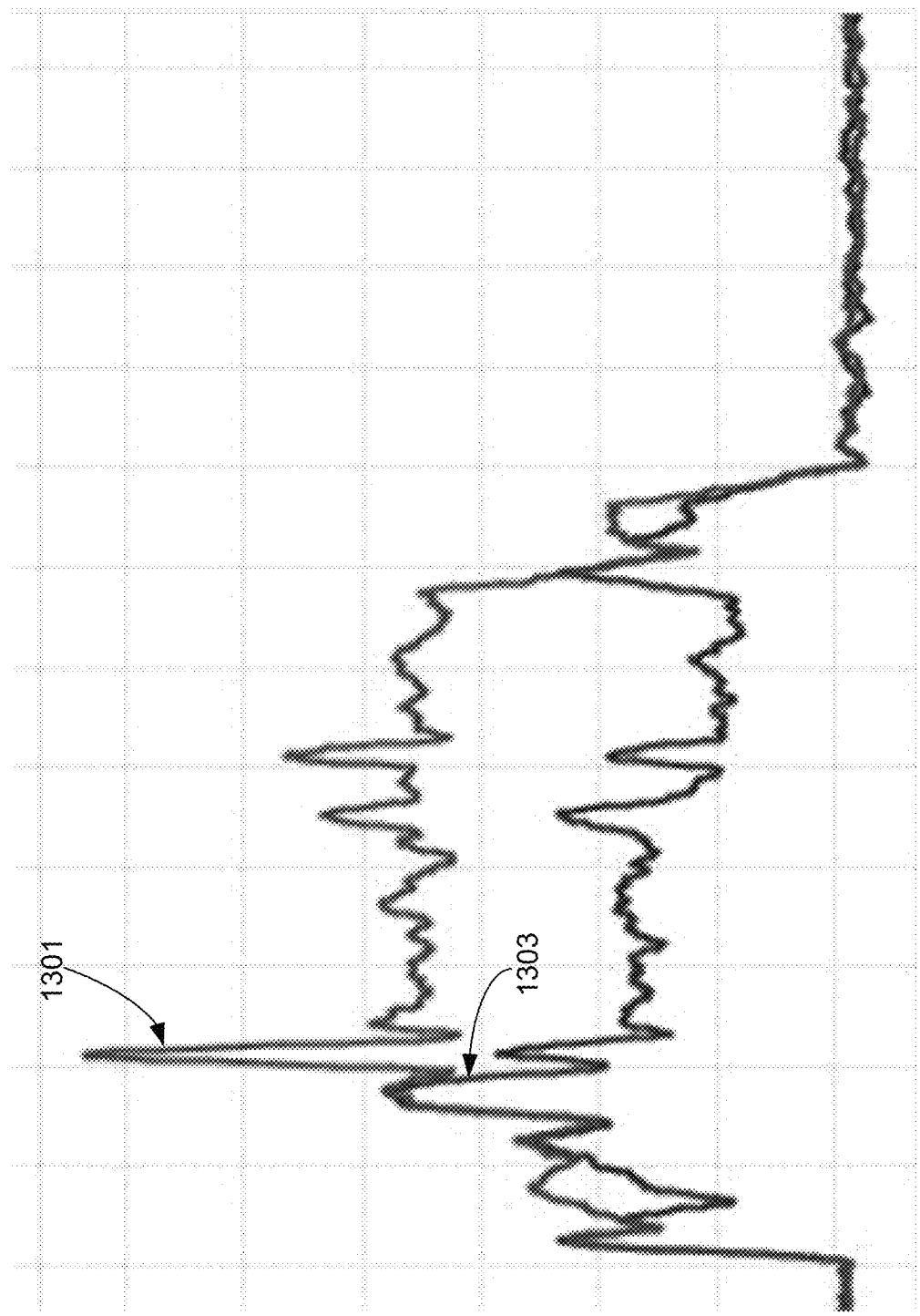
FIG. 13 illustrates the current level Icc for a memory die during a read operation for an open block and for a closed block.

FIG. 13 illustrates the current level Icc for a memory die during a read operation for an open block and for a closed block. More specifically, FIG. 13 shows Icc as a function of time for a read operation for a closed block overlaid with the corresponding waveform for a closed block. This read could be, in a 3 bit per cell example, for an upper page, middle page, or lower page on a selected word line, where the waveforms are similar for the different pages of data and for different selected word lines of a block. The open block Icc curve is higher through the central regions with its primary peak labelled at 1301, with the primary peak for the closed block Icc curve having its primary peak labelled at 1303. Initially, both curves ramp up similarly to the peak at 1303, after which the closed block Icc drops down; however, the open block Icc curve continues to ramp up to the peak 1301 before dropping down. As shown, the Icc peak position in time changes between an open block (at 1301) and a closed block (1303). In closed block, the Icc peak 1303 occurs when the word lines are ramping. The open block will also see an Icc increase at this time, but the Icc peak 1301 will now occur somewhat later when the bit lines ramp up. As the memory cells in an open block are in an erased state, while the memory cells in a closed block have been programmed, the NAND strings in an open block will be more conductive and more current will flow through the block as the bit lines ramp up. For example, as illustrated in FIG. 13 the maximum amplitude of Icc for an open block at 1301 is approximately twice the closed block Icc peak 1303.

Figure 14:
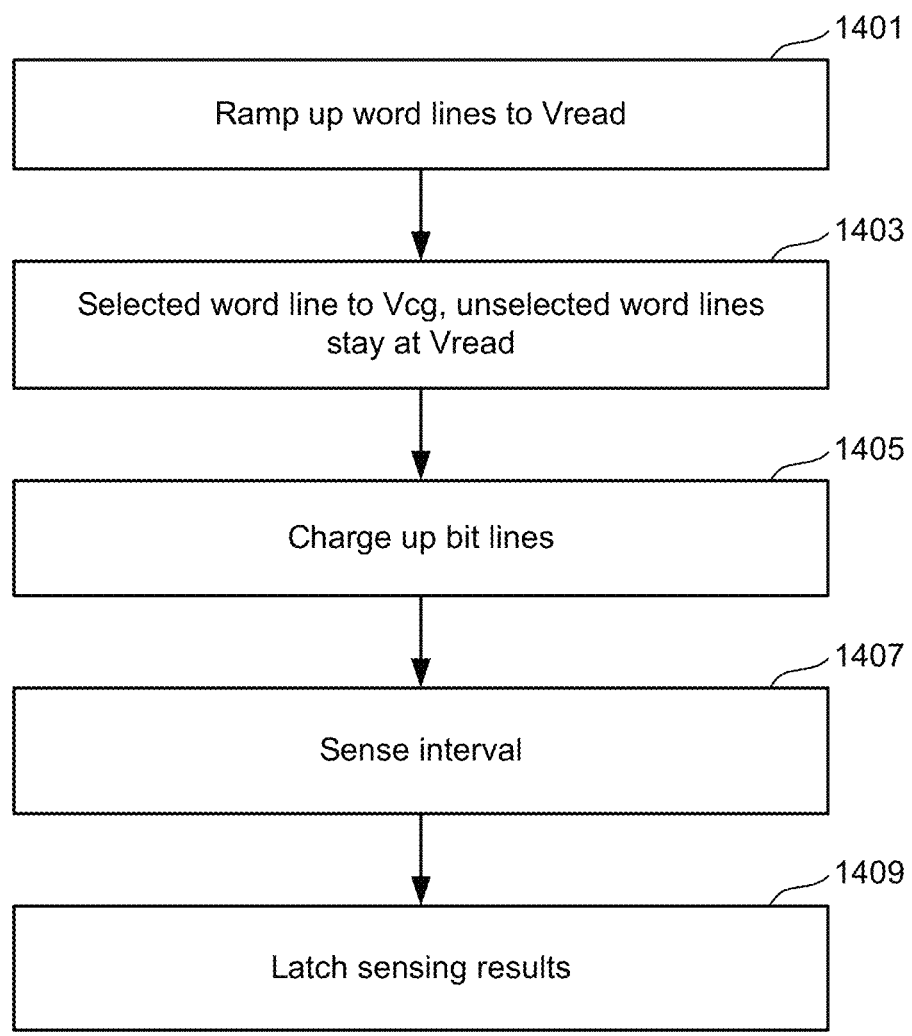
FIG. 14 is a flowchart of an embodiment for a sensing operation in a block of NAND memory.

FIG. 14 is a flowchart of an embodiment for a sensing operation in a block of NAND memory. The read process is performed in response to a read command from the memory controller 102 as received by the system control logic 360 of the memory die 300 in the embodiment of FIG. 3A or of the control die 311 in the embodiment of FIG. 3B. The read command can be a host read or a read generated by the memory controller 102, such as for garbage collection or other data management operation. In the case of a verify operation, the sensing would be part of the programming or erase operation.

To read a selected memory cell along a NAND string, the other memory cells of the NAND string need to be in an on state. To this end, at step 1401 the unselected word lines are ramped up by the row control circuitry to the unselected word line read voltage Vread, where Vread needs to be high enough to fully turn on an unselected memory cell for any of the data states that it may be storing. Referring back to the example of FIG. 7B, the means that Vread needs to greater that the expected threshold voltage of memory cells programmed to the S7 state. For example, if Vv7 is around 3V, Vread might be in the 6.5-7V range. This will typically be higher than the on die supply Vdd, so that Vread is generated in a charge pump. In some embodiments, ramping the word lines of a block to Vread can be done in two steps, first from 0V to Vdd by using the supply level, then from Vdd to Vread. To simplify the process, the selected word line is often ramped up at the same time as the unselected word lines, so that all word lines are ramped up at step 1401. Depending on the embodiment, the select gates at the ends of the NAND strings can also be biased to be on at this point and the source line voltage set to ground or other relatively low voltage.

Once the unselected word lines have ramped up to Vread, at step 1403 the row control circuitry biases the selected word at a control gate read voltage Vcg while, while the unselected word lines stay at Vread. If the selected word line has been ramped up to Vread in step 1401, it will be ramped down to Vcg, while, if it was not ramped up at step 1401, it may be ramped up Vcg. The value of Vcg can correspond to one of the read or verify values illustrated in FIG. 7B based on the sensing operation being performed. Once the bias conditions on the word lines are set for the block, the bit lines are charged up at step 1405 by the column control circuitry 310. The sensing operation by the sense amps 350 then follows at step 1407. A number of embodiments for the sensing operation can be used; for example, in one set of embodiments, a capacitor in a sense amplifier for each of the bit lines is pre-charged and then discharged through the corresponding NAND string for a sensing interval, where the amount of discharge will depend on the Vcg level relative to the threshold voltage Vth of the selected memory cell on the NAND string. The results of the sensing operation are then latched at step 1409 into the data latches 484 of the sense amp structure.

Referring back to FIG. 13 and the closed block Icc peak 1303, this will occur at step 1401 of FIG. 14. For a closed block, the word lines will have been written and in a programmed state. During the read, at step 1401 the word lines ramp up to Vread and this will be when peak Icc occurs. In particular, the peak will occur due to the current drawn by the charge pump or pumps in boosting the word line voltage above the high on die supply level of Vdd to the Vread level. Consequently, in embodiments where, in step 1401, the word line voltage is first ramped up from 0V to Vdd and then from Vdd to Vread, the peak will occur when as pump current in the Vdd to Vread sub-step. The closed block Icc may also see a second, but smaller, peak at step 1405 as the bit lines ramp up, but, as discussed below with respect to FIG. 15, this has less impact as the channels of the NAND strings are quite resistive and the current through the individual NAND strings (Icell) is relatively low.

Considering the open block case, the word lines in an open block are in an erased state with a low, often negative, threshold voltage. As in the closed block case the Icc level will again increase as the word lines are ramped up, but this will be followed by the later peak 1301. This will occur at step 1405 due to the Icell current from when the bit lines are charged up. Relative to the closed block case, the Icell current at step 1405 is higher due to the increased overdrive from Vread (i.e., relative level of Vread with respect to Vth) when the cells are in an erased state, as illustrated schematically with respect to FIG. 15.

Figure 15A:
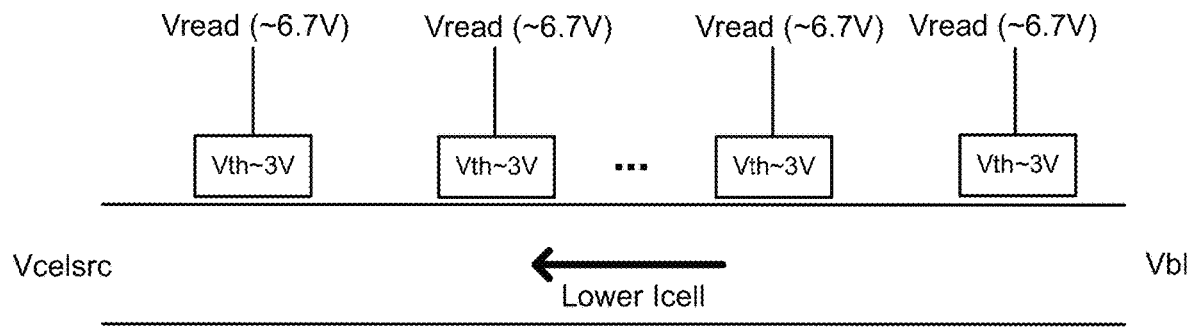
FIGS. 15A and 15B illustrates the effect of a block being open or closed on the current through the NAND strings of a block during the charging up of the bit lines of a block
Figure 15B:
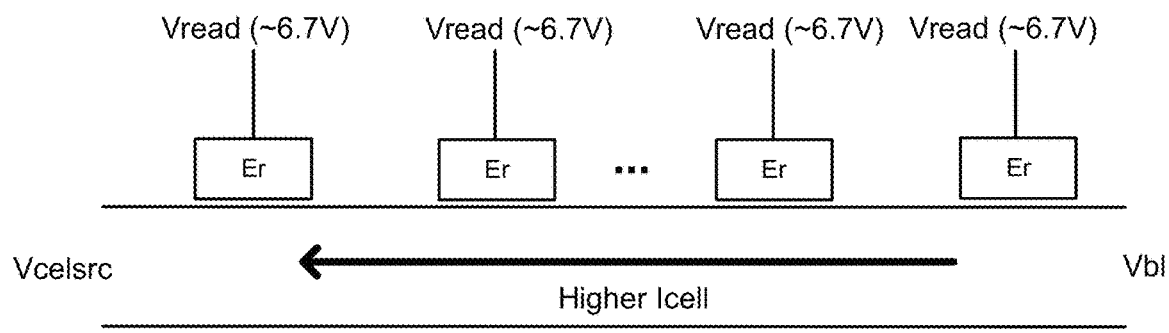

FIGS. 15A and 15B illustrates the effect of a block being open or closed on the current through the NAND strings of a block during the charging up of the bit lines of a block. FIG. 15 is a schematic representation of a portion of a NAND string showing some of the memory cells of the NAND string above the channel with their threshold voltage or state inside the box representing the memory cell. After the word lines are ramped up to Vread, the amount of overdrive for the memory cells will depend on the threshold voltage of the memory cells along the NAND string. At top, FIG. 15A shows the case for when the memory cells have already been written with data; and, at bottom, FIG. 15B the case when the memory cells are still in an erased state. When memory cells along the NAND string are in an erased state, as in an open or mostly open block, memory cells will be in an erased state with a low or negative Vth and the overdrive voltage will be high and result in a higher Icell in each of the NAND strings. For a closed block, as represented at top, the memory cells will have cells have a higher Vth, of ~3V for example, and the overdrive will be less and Icell will consequently also be less. Because of this, in the case of a closed block the Icc level will be less than during step 1401, while in the case of an open block the peak 1301 during step 1405 will be dominant.

As noted above, multiple memory dies are typically formed into packages and can be operated in parallel, as represented schematically in FIG. 2B; and although this can result in increased performance, this can cause the Icc peaks the multiple dies to align and result in excessive Icc peaks. To avoid these composite peaks, time division peak power management (TDPPM) can be used to introduce time delays between the dies operated in parallel when these peaks occur in the individual dies of the group. All of the dies 300 of a group operated by the memory controller 102 are connected through their external pads to the memory controller 102, which feeds a common clock to the memory dies 300. The memory controller 102 can introduce relative delays between the individual dies 300 the group of dies for the high Icc peak operations so that the peaks do not align. Rather than having just a single point in the read process where a delay can be introduced, delays can instead be introduced at different points in the read process depending upon the degree to which a block is open or closed.

Figure 16A:
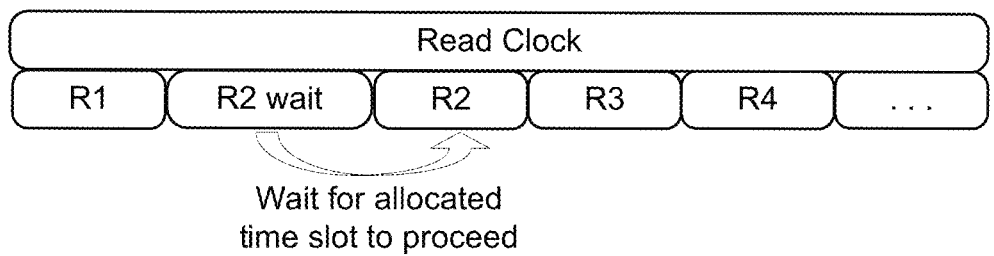
FIGS. 16A and 16B illustrate embodiments for the introduction of an offset at different points into the read process for a closed block and an open block, respectively.
Figure 16B:
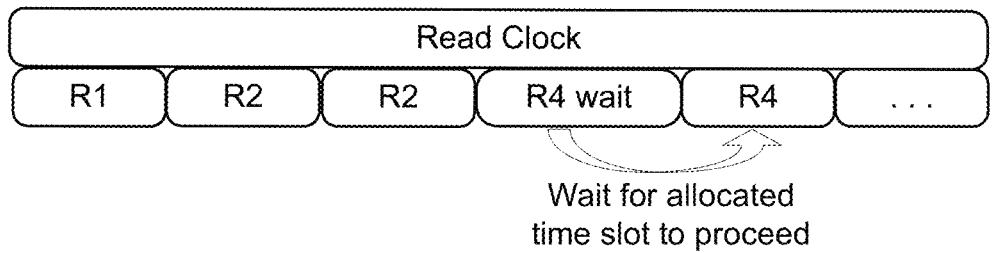

To account for the differences in Icc peaks based on the degree to which a block is programmed, separate TDPPM checkpoints can be used with different parameters for an open block relative to a closed block, where the registers in storage 366 can store these parameters. FIGS. 16A and 16B illustrates the different locations where the relative delays can be introduced to account for different peaks.

FIGS. 16A and 16B illustrate embodiments for the introduction of an offset at different points into the read process for a closed block and an open block, respectively. In both cases the memory controller 102 issues read commands to the set of memory die, where it is received at the corresponding memory die 300 in the embodiment of FIG. 3A or control die 311 in the embodiment of FIG. 3B. The read process is performed according to the external read clock from the controller. The read process is broken up into several sub-phases as described with respect to FIG. 14. R1 and R2 correspond to step 1401 that, in this embodiment, is broken up into an initial ramp up to Vdd during the R1 clock phase, then from Vdd to Vread in the R2 clock phase. R3 corresponds to step 1403 when the selected bit line is biased to the Vcg for the read operation as specified by the memory controller 102 or determined by the system control logic. R4 corresponds to charging up at the bit lines in step 1405, with the later stages of the read process just indicated by the ellipsis.

As discussed above, for a closed, or mostly closed, block the primary peak 1303 will occur at R2 due to the charge pump current used to generate Vread. As illustrated in FIG. 16A, to account for this a new sub-clock inserted for time division for peak current management timing before R2, during which the die will wait for the corresponding time slot allocated by the controller to proceed with R2 and the ramping up of the word lines to Vread.

In the case of the open, or largely open, block the primary peak of 1301 will occur at R4 when the bit lines are charged up due to the larger current through the NAND strings. As illustrated in FIG. 16B, to account for this a new sub-clock inserted for time division for peak current management timing before R4, during which the die will wait for the corresponding time slot allocated by the controller to proceed with R4 and the charging up of the bit lines prior to the sensing interval.

Figure 17:
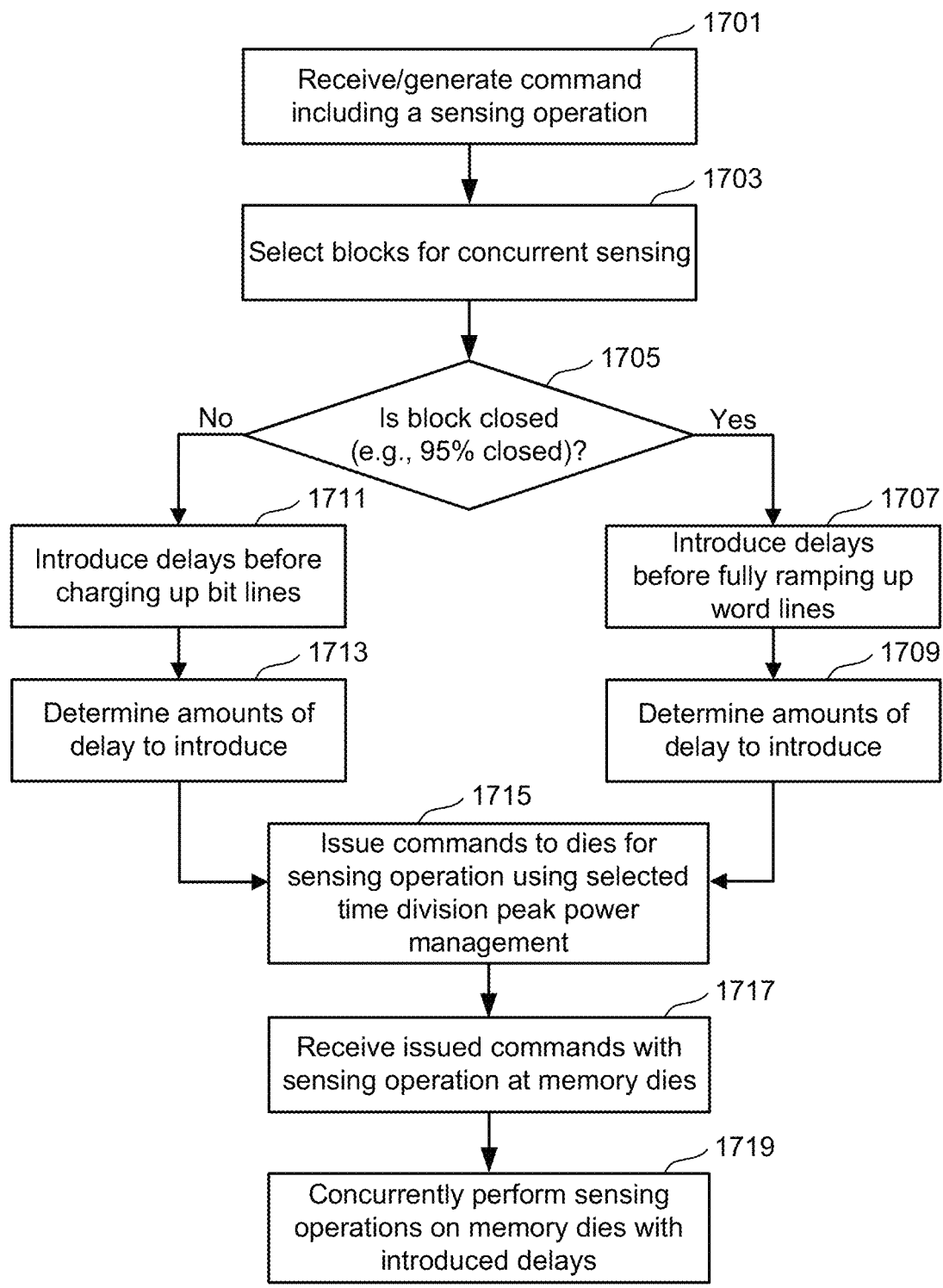
FIG. 17 is a flow chart for an embodiment to incorporate time division for peak current management in to the read process that can account for the relative openness or closedness of selected memory block.

FIG. 17 is a flow chart for an embodiment to incorporate time division for peak current management into the read process in a way that can account for the relative openness or closedness of selected memory blocks. Beginning at step 1701, the memory controller 102 receives or generates a command that includes a sensing operation. The sensing operation can originate from a host 120, such as a read for user data, or originate on the memory controller itself, such as a read for garbage collection or other housekeeping operations. Although discussed primarily in the context of a read, this process can also be applied to other commands that include a sensing operation, such as the verify phase of a program or erase operation. At step 1703 the controller then selects the blocks of memory cells to read from the set of dies operated as a group in parallel. When operating multiple memory dies 300 together, as illustrated in FIG. 2B, the controller 102 can select a block from an array from each of multiple ones of these dies. For example, in a memory system such as an SSD, a memory controller may operate groups of eight memory dies in parallel and could select a block from each of the eight dies.

Once the blocks are selected, at step 1705 the memory controller 102 determines the extent to which each of the blocks are open or closed. For managing the memory dies 300, the memory controller 102 will typically maintain an inventory of which blocks are fully closed and which blocks are open and the extent to which they are open. For example, in an open block, word lines are written sequentially across a block (or sub-block) so that controller will know the word line next for programming. This information can be maintained in the memory controller in memory locations such as SRAM 230/260, buffer 232/262, or MRAM/DRAM/ReRAM 106. Referring back to FIG. 13, the dominant Icc peak will shift from the open block peak 1301 to the closed block peak 1303 as the block becomes more extensively written. The determination of step 1705 can be made by the logic of the memory controller based on the extent to which a block is closed based on a limit value at which the peak 1303 is expected to become dominant relative to the peak 1301. This limit can be determined as part of device characterization, for example, and may be somewhere in the range of 90% to fully closed, where step 1705 gives an example of 95% closed, such as when all but a few word lines of the block have already been written.

In order have relative delays between the different dies, the amount of the delay for the selected sub-operation will vary from die to die, where the incremental increase can be based on the die number within the set, for example (i.e., Die 1 has one increment of delay, Die 2 has two increments, and so on). In some embodiments, different delay incrementations can be used between the closed memory dies and the open dies.

If the block is closed with the limit (e.g., 95%), at step 1707 a delay is introduced before fully ramping up the word lines. As discussed with respect to FIG. 16A, if the word lines are ramped up in two steps, first to Vdd and then from Vdd to Vread, the delays can be introduced before the Vdd to Vread ramping sub-operation where the Icc peak is due to charge pump current from charge pumps located in the power control block 364, for example. At step 1709, the amount of the delay introduced before ramping up to Vread for a given die of a set can be incrementally based on the number and sequence of die numbering of the dies receiving this delay. For example, say if Die 0, Die 4, and Die 5 are determined to be closed and step 1707 introduces the delay before Vread ramp up, Die 0 could have no delay and Die 4 has a first amount of introduced delay (such as some number n of read clock cycles), Die 5 could have this this amount of delay (e.g., 2n read clock cycles) introduced, where the value for n could be based on the width of the peak 1303 as determined as part of device characterization.

If the block is not closed at step 1705, at step 1711 the delay is introduced before charging the bit lines as discussed with respect to FIG. 16B. The amount of the introduced delay is determined at step 1713 for a given die of a set can again be incrementally based on the number and sequence of die numbering of the dies receiving this delay. For example, say if Dies 1-3, Die 6, and Die 7 are determined to be closed and step 1711 introduces the delay before charging up the bit lines, Die 1 could have no delay, Die 2 could have a first amount of introduced delay (such as some number m of read clock cycles), Die 3 could have 2 m read clock cycles of delay, Die 6 could have 3 m read clock cycles of delay, and Die 7 could have 4 m read clock cycles of delay introduced, where the value for m could be based on the width of the peak 1301 as determined as part of device characterization. The values for n and m may be different or the same can be saved as register values, for example.

Once the delays are determined for each of the dies, at step 1715 the controller 102 can issue the sensing commands to the dies 300 that include the selected time division peak power managements. The commands are then received by the corresponding memory dies 300 at step 1717. At step 1719 the memory dies can currently execute the operation according to a read clock using their corresponding location and amounts of introduced delay. The concurrent sensing operations can be as described above with respect to FIG. 14, but with the corresponding delays introduced before either step 1401 or 1405.

The techniques presented here have considered a particular memory operation (sensing) for a particular memory technology (NAND memory) for Icc peaks in two particularly sub-operations (Vread ramp up, bit line charging) based on a particular property (whether a block is open or closed), but they may be applied more generally. For example, in different memory technologies (e.g. MRAM or phase change memory) or even in other memory operations for NAND memory, different dominant current peaks may occur for different sub-operations or phases of a memory operation depending on a property of a block or other selected memory division. Based on the state of this property, the relative delays can be introduced between different memory arrays or dies being operated in parallel to reduce the accumulated Icc from the multiple dies or arrays. The technique can also be externed to more than two peaks corresponding to different phases or sub-operations.

As noted in the preceding discussion, Icc levels during a sensing operation can be significantly higher for open blocks than for closed blocks. It is also found that Icc levels have a temperature dependence, with the Icc sensing level increases for an open block being higher at lower temperatures than at high temperatures. Similarly, higher program ICC values are also a technology bottleneck and typical countermeasures can involve significant performance penalties. The next portion of the discussion considers techniques to help reduce Icc levels by sensing the temperature rise from the power dissipated due to higher Icc levels and updating the temperature coefficient (TCO) values for the corresponding bias levels (such a bit line clamp voltages (VBLC), Vread levels, and so on) that contribute to this ICC to rise. The embodiments presented in the following introduce a distributed heat sensing circuit over the memory array in order to sense the temperature rise due to high Icc induced power dissipation. Based on a calculation of the temperature rise from Icc, an algorithm to monitor and control Icc is presented.

Figure 18:
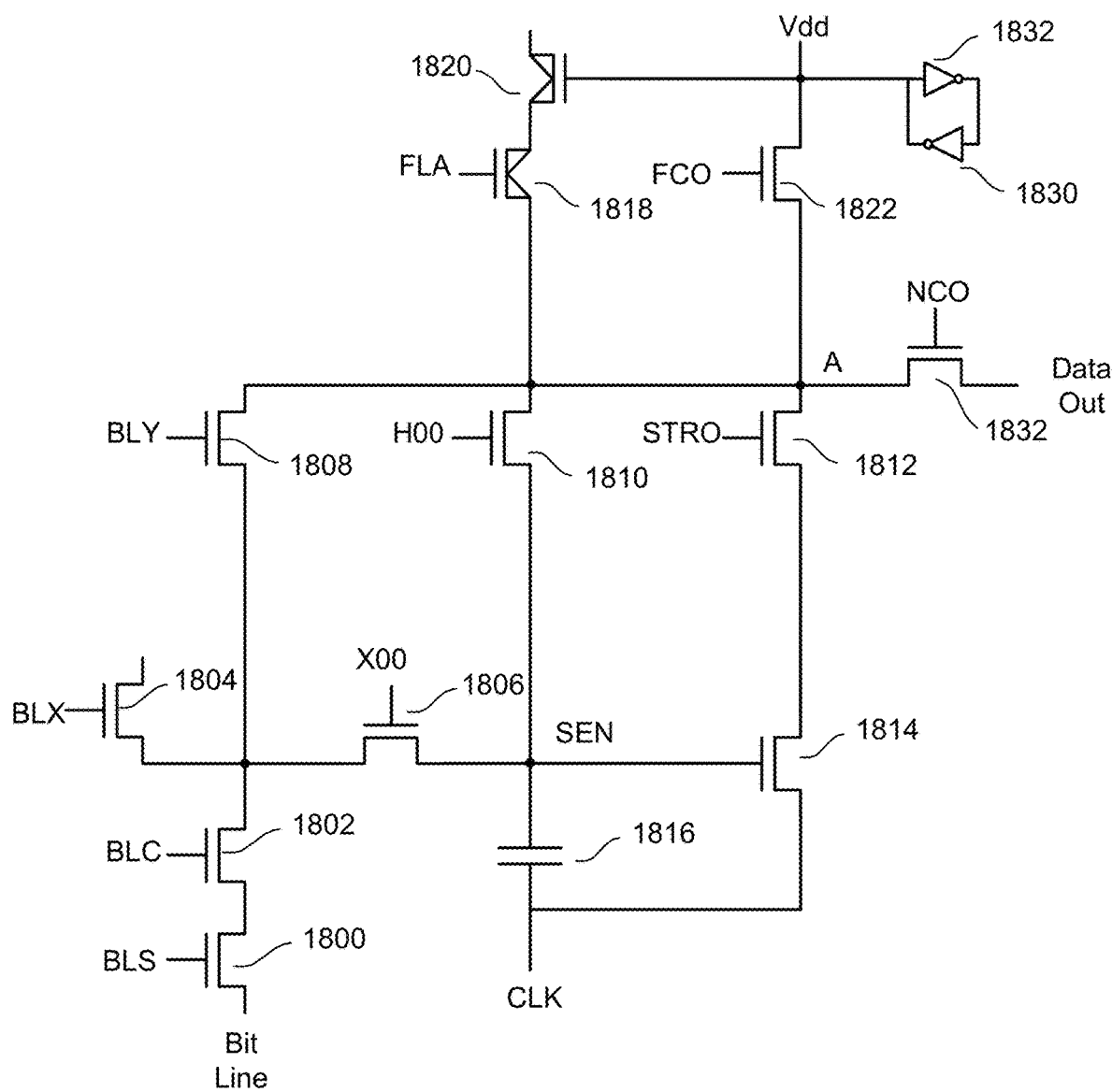
FIG. 18 is a schematic diagram of one example embodiment of a sense amplifier circuit to illustrate the operation of a bit line clamp voltage.

More specifically, as discussed with respect to FIG. 13, the open block Icc curve is higher through the central regions with its primary peak labelled at 1301, with the primary peak for the closed block Icc curve having its primary peak labelled at 1303. This primary open block peak is due to the ramping up of the bit line clamp voltage VBLC. In addition to the variation due to the degree to which a block is open or closed, these Icc levels are also temperature dependent, particularly in the open block case. Consequently, if the memory system can sense the peak Icc during a memory operation getting above a threshold level, the control circuitry can dial VBLC down for the successive peaks of the operation through changing it temperature coefficient, TCO_VBLC. The following embodiments sense peak Icc levels during memory operations by sensing junction temperatures on the memory array due to power dissipation from the higher Icc levels. Although the main examples used below will often use the VBLC example, the techniques can similarly be applied to other bias levels, such as Vread or Vpass for example. FIG. 18 provides some additional detail on the function of VBLC in memory circuits like those described above.

FIG. 18 is a schematic diagram of one example embodiment of a sense amplifier circuit to illustrate the operation of a bit line clamp voltage. The sense amplifier of FIG. 18 can be used to measure the conduction current of a memory cell during a read or verify operation, which may comprise sense amplifiers 330 illustrated above. As described below, the circuit of FIG. 18 pre-charges a capacitor (or other charge storage device) to a pre-charge magnitude, discharges the capacitor through the memory cell for the duration of a sense time, and senses voltage at the capacitor after the sense time. The sense voltage will be indicative of whether the memory cells conducted the current being sensed for, which is indicative of whether the threshold voltage of the memory cell is greater than or less than threshold voltage being tested for. If the threshold voltage of the memory cell is greater than the threshold voltage being tested, then, during a verify operation, the memory cell will complete programming, as appropriate based on the processes described herein. FIG. 18 shows bit line select transistor 1800 connected to the Bit Line and bit line clamp transistor 1802. Transistor 1800 receives the signal BLS at its gate, and is used to connect to or isolate the bit line. Transistor BLC 1802 receives the bit line clamp voltage VBLC at its gate, and is used as a voltage clamp. The gate voltage VBLC is biased at a voltage equal to the desired bit line voltage plus the threshold voltage of transistor 1802. The function of the bit line clamp transistor 1802, therefore, is to maintain a constant bit line voltage during a sensing operation (during read or verify), even if the current through the bit line changes.

Bit line claim transistor 1802 is connected to transistors 1804, 1806, and 1808. Transistor 1806 is connected to capacitor 1816 at the node marked SEN. The purpose of transistor 1806 is to connect capacitor 1816 to the bit line and disconnect capacitor 1816 from the bit line so that capacitor 1816 is in selective communication with through the bit line select transistor BLC 1800 to the bit line. In other words, transistor 1806 regulates the sense time. That is, while transistor 1806 is turned on capacitor 1816 can discharge through the Bit Line, and when transistor 1806 is turned off capacitor 1816 cannot discharge through the bit line. To control the sense time, the state machine 362 (optionally at the direction of Controller 1002) controls transistor 1806.

The node at which transistor 1806 connects to capacitor 1816 is also connected to transistor 1810 and transistor 1814. Transistor 1810 is connected to transistors 1808, 1812, and 1818. Transistor 1818 is also connected to transistor 1820. In this embodiment, transistors 1818 and 1820 are PMOS transistors while the other transistors of FIG. 8 are NMOS transistors. Transistors 1810, 1818, and 1820 provide a pre-charging path to capacitor 1816. A voltage (e.g. Vdd or other voltage) is applied to the source of transistor 1820. By appropriately biasing transistors 1810, 1818, and 1820, the voltage applied to the source of transistor 1820 can be used to pre-charge capacitor 1816. After pre-charging, capacitor 1816 can discharge through the Bit Line via transistor 1806 (assuming that transistors 1800 and 1802 are conducting).

The circuit of FIG. 18 includes inverters 1830 and 1832 forming a latch circuit. The output of inverter 1832 is connected to the input of inverter 1830 and the output of inverter 1830 is connected to the input of inverter 1832. as well as transistors 1820 and 1822. The input of inverter 1832 will receive Vdd and the two inverters 1830, 1832 will act as a latch to store Vdd. The input of inverter 1832 can also be connected to another value. Transistors 1812 and 1822 provide a path for communicating the data stored by inverters 1830 and 1832 to transistor 1814. Transistor 1822 receives the signal FCO at its gate. Transistor 1812 receives the signal STRO at its gate. By raising or lowering FCO and STRO, a path is provided or cut off between the inverters 1830, 1832 and transistor (sensing switch) 1814. The gate of transistor 1814 is connected capacitor 1816, transistor 1806 and transistor 1810 at the node marked SEN. The other end of capacitor 1816 is connected to the signal CLK.

As discussed above, capacitor 1816 is pre-charged via transistors 1810, 1818, and 1820. This will raise the voltage at the SEN node to a pre-charge voltage level (Vpre). When transistor 1806 turns on, capacitor 1816 can discharge its charge through the bit line and the selected memory cell if the threshold voltage of the memory cell is below the voltage level being tested for. If the capacitor 1816 is able to discharge, then the voltage at the capacitor (at the SEN node) will decrease.

The pre-charge voltage (Vpre) at the SEN node is greater than the threshold voltage of transistor 1814; therefore, prior to the sense time, transistor 1814 is on (conducting). Since transistor 1814 is on during the sense time, then transistor 1812 should be off. If the capacitor does not discharge during the sense time, then the voltage at the SEN node will remain above the threshold voltage of transistor 1814 and the charge at the inverters 1830, 1832 can be discharged into the CLK signal when STRO turns on transistor 1812. If the capacitor discharges sufficiently during the sense time, then the voltage at the SEN node will decrease below the threshold voltage of transistor 1814; thereby, turning off transistor 1814 and the data (e.g., Vdd) stored at inverters 1830, 1832 from being discharged through CLK. So testing whether the diodes 1830, 1832 maintain their charge or discharge will indicate the result of the verification process. In one embodiment, the result can be read at node A via transistor 1834 (Data Out) by turning on transistor 1834 gate signal NCO.

The pre-charge level of capacitor 1816 (and, thus, the pre-charge voltage at node SEN) is limited by the current passing through transistor 1810. The current that passes through transistor 1810 is limited by the gate voltage H00. As such, the pre-charge voltage at node SEN is limited by the voltage H00 less the threshold voltage of transistor 1810. With this arrangement, the system can regulate the pre-charge voltage at node SEN by regulating H00. A larger voltage at H00 results in a larger voltage at the SEN node when pre-charging. A lower voltage at H00 results in a lower voltage at the SEN node when pre-charging. When the system performs a read or verify operation (both are sense operations), the voltage applied to the control gate of the cell may cause the channel (connected to the bit line) of the cell to conduct. If this happens, a capacitor is discharged through the channel, lowering its voltage as it discharges.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 7B) or verify operation (e.g. see verify target levels Vv1, Vv2, Vv3, Vv4, Vv5, Vv6, and Vv7 of FIG. 7B) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used, but this illustrates the use of the bit line clamp transistors and their bias levels VBLC.

Figure 19:
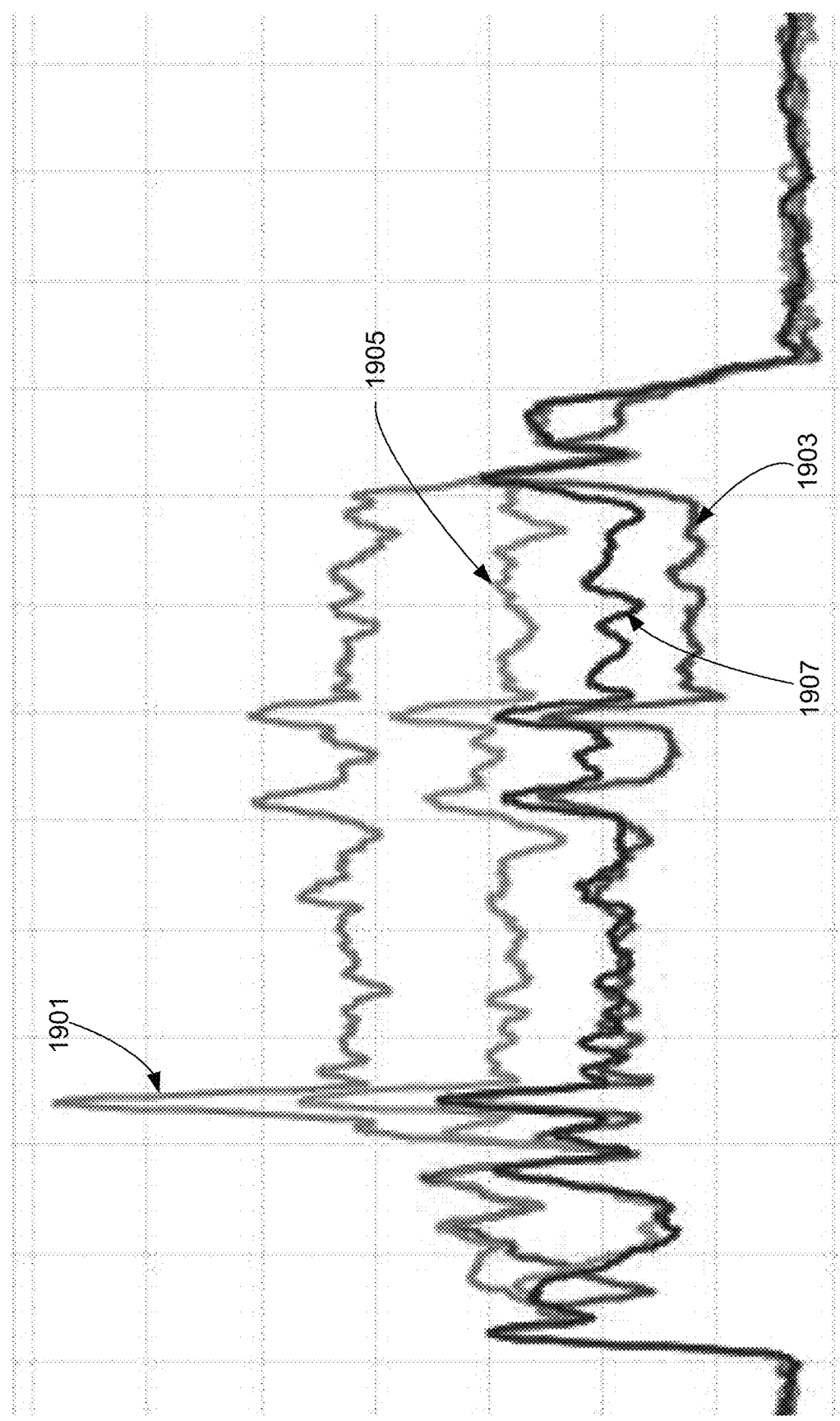
FIG. 19 illustrates the current level Icc for a memory die during a read operation for an open block, for a closed block, and for an open block with adjusted bias levels.

Returning now to the consideration of Icc levels and their dependence on the degree to which a block is open or closed and the effects of temperature, FIG. 13 illustrated the current level Icc for a memory die during a read operation for an open block at 1301 and for a closed block at 1303. FIG. 19 further illustates the effect of altering the Vread and VBLC voltage levels on Icc.

FIG. 19 illustrates the current level Icc for a memory die during a read operation for an open block, for a closed block, and for an open block with adjusted bias levels. More specifically, FIG. 19 shows Icc as a function of time for a read operation for a closed block 1903 overlaid with the corresponding waveform 1901 for an open block with the same bias condition, with waveform 1905 for an open block with the Vread level altered and waveform 1907 for an open block with the Vread and VBLC levels altered. This read could be, in a 3 bit per cell example, for an upper page, middle page, or lower page on a selected word line, where the waveforms are similar for the different pages of data and for different selected word lines of a block. The open block waveform 1901 and closed block waveform 1903 are similar to the corresponding waveforms 1301 and 1303 of FIG. 13 described above. The waveforms 1905 and 1907 also correspond to the sensing operation for an open block, but with changed bias conditions. In the case of 1905, the Vread voltage applied to non-selected word lines has be lowered, lowering the Icc waveform of 1905 to be roughly halfway down to the closed block waveform 1903 of a closed block. In the case of 1907, in addition to the Vread voltage applied to non-selected word lines being lowered, the bit line clamp voltage VBLC has also been lowered, further lowering the Icc waveform of 1907. These lowered Icc waveforms illustrate how, in an open or largely open block, the increased Icc current due to a higher Vread on erased word lines and higher bit line charging current. These effects are found to be greater at lower temperatures than at higher temperatures.

Figure 20:
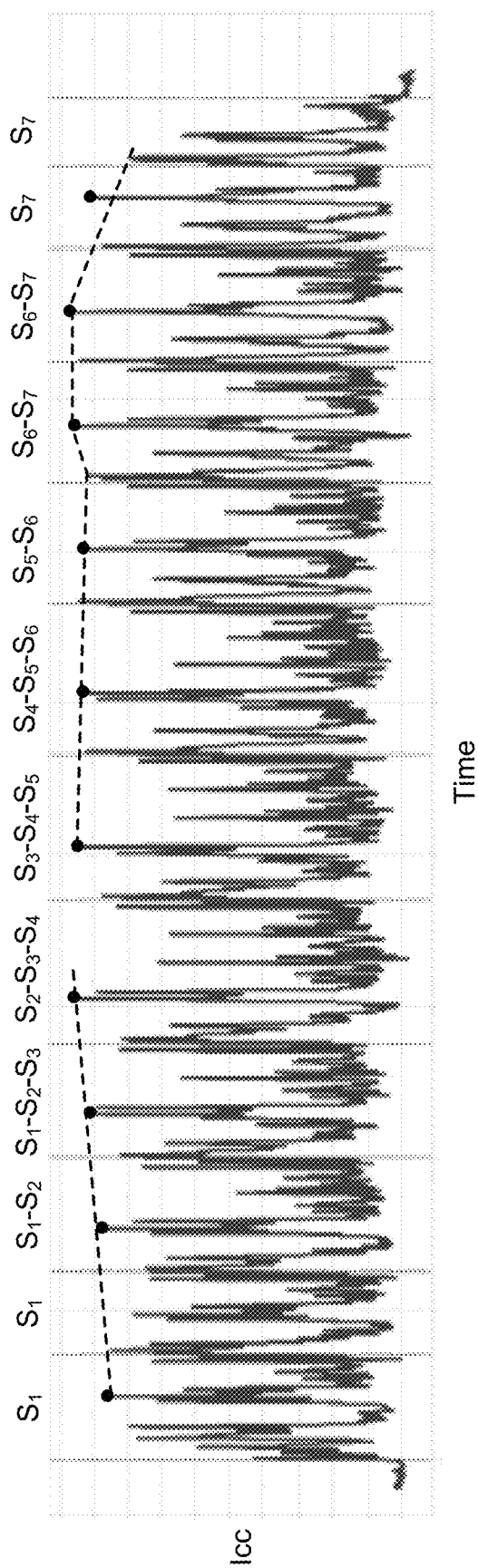
FIG. 20 shows Icc vs time for a three-level cell (TLC) programming operation.

FIG. 20 shows Icc vs time for an example of a three-level cell (TLC) programming operation, with the states being verified after each of the 12 pulses of this example shown at top. As shown, a smart verify arrangement is used, where initially only the S1 state is verified, with additional higher states being added in and lower states dropped out as programming continues, until only S7 is checked for the last two pulses. The Icc waveform shows that the largest peaks occur after S3 completes. By sensing and monitoring the peak Icc values during the earlier pulses of the program operation, countermeasures can then be applied for the successive pulses. For example, in FIG. 20 the main peak (that is marked by the black dots connected by the lines and that is also repeating) is from the unselected word lines ramping up to Vread. Consequently, the amplitude of these peaks will depend on Vread. This will also be the case of Icc contributions for other bias levels, such as for biasing the bit lines (VBLC) and for the unselected word lines' program pass voltage (Vpass). Consequently, if the memory system can sense the Icc peak getting above a threshold in the early phases of the write, it can dial down Vread and/or other bias levels for the successive peaks of the write through their temperature coefficient (Tco) changes. Embodiments presented here sense the peak Icc levels by sensing the junction temperature rise to do power dissipation from the higher Icc.

Memory devices often have a temperature sensor to monitor the ambient temperature and, based on a temperature coefficient (Tco) for the bias conditions, vary various these bias conditions. What is being presented in the embodiments presented here is supplemental to the ambient temperature compensation. These embodiments consider the temperature rise during a memory operation (such as a data write) during that operation and, still during that operation, modify the bias conditions for the remainder of that operation. This can include updating during a given operation. When a memory die includes multiple planes, this can be done independently for each of the planes.

Looking at the calculation of temperature rise from peak Icc values, in order activate temperature compensation through the temperature coefficients before the Icc reaches its peak, the system should sense the temperature rise when the current is somewhat below peak, such as 60% below of its peak value, for example. Taking some example values, for a peak Icc=200 mA for only word line 0 programmed in the open block case, power dissipation (PD) with Vcc=2.5V would be PD=(200×10$^{-3}$ amp)*2.5*0.6=0.3 W. Taking a thermal resistance (junction to ambient) of Rth=(17 to 50) degrees Celsius per Watt (C/W) for a NAND die, the temperature rise ΔT, would be:

$$\Delta T = R_{th} \times P_d = 0.3 * (17 \text{ C. to } 50 \text{ C.}) = 5 \text{ C. to } 15 \text{ C.}$$

This ΔT=5C to 15C change could be used to update the temperature coefficients, such as TCO_VBLC, from s default value, so that VBLC is lowered and, consequently, the Icc peak is suppressed. For example, if TCO is set to −1.56 mV/C, which will take VBLC to 0.3V from 0.4V for the temperature going from 85C to 25C. For a 15C temperature rise, Tco can be updated to, for example, −0.39 mV/C, where this updated TCO can be applied to update VBLC=0.4V→0.32V. This updating process can be performed on the microsecond scale so that the bias level in a memory access operation (e.g., read or program) can be performed during the memory access operation.

Figure 21:
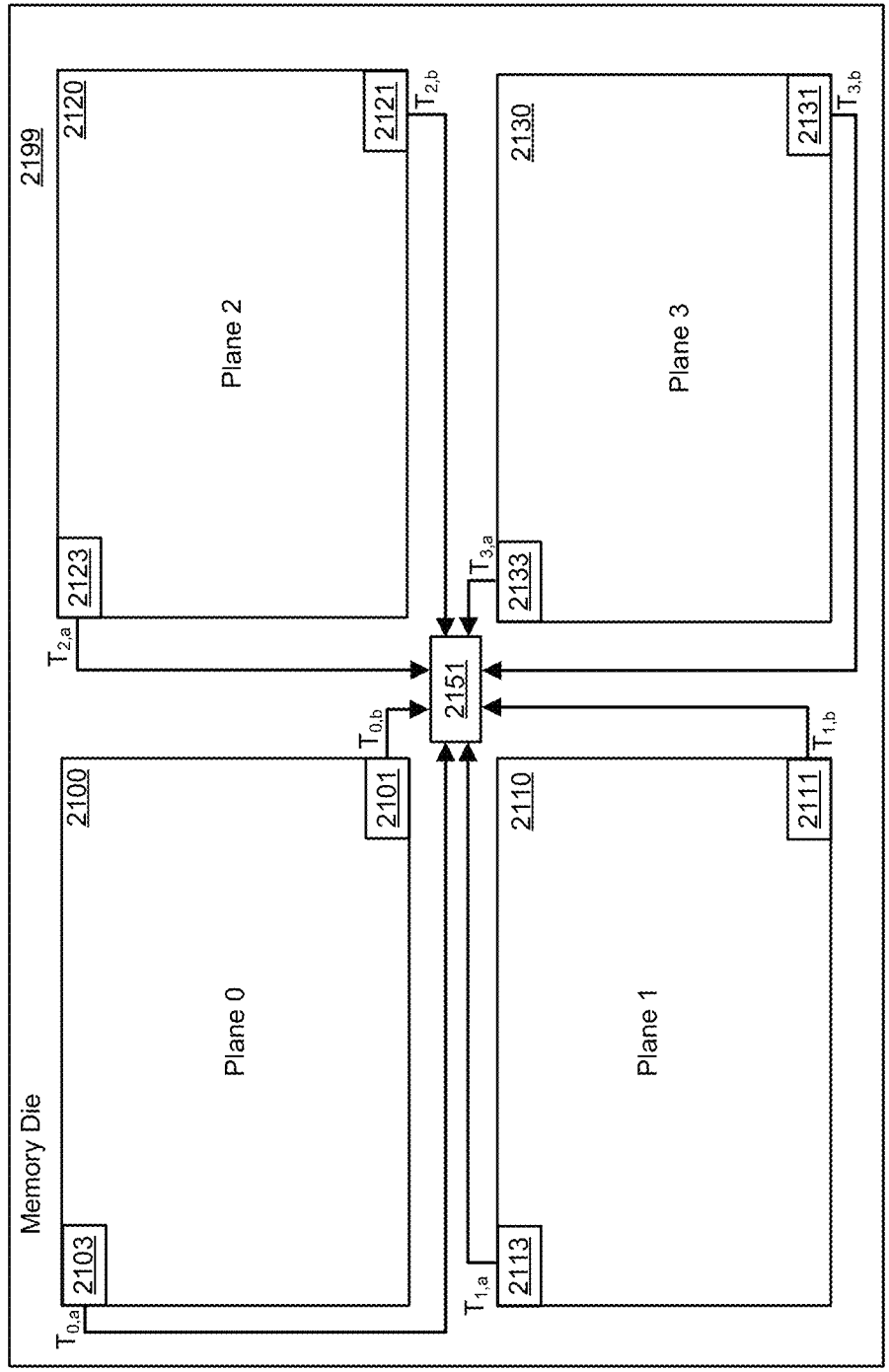
FIG. 21 is a block diagram of an embodiment for a memory die with individual temperature sensing for each plane using distributed temperature sensors.

FIG. 21 is a block diagram of an embodiment for a memory die with individual temperature sensing for each plane to provide distributed temperature sensoring. In this example the memory die 2199 has four planes (Plane 0 2100, Plane 1 2110, Plane 2 2120, Plane 3 2130) each with a corresponding set of temperature sensing circuits (2101, 2103; 2111, 2113; 2121, 2123; 2131, 2133) that can sense local temperature rise due to peak Icc independently for each plane. The memory die 2099 can correspond to either the memory die 301 of the embodiment of FIG. 3B or the memory die 300 of FIG. 3A, in which case the control circuitry of the die would be located around the periphery of the array but (other than TCO compensation circuit 2151) is not shown in FIG. 21. TCO compensation circuit 2151 receives temperature values (respectively $T_{0,a}$, $T_{0,b}$; $T_{1,a}$, $T_{1,b}$; $T_{2,a}$, $T_{2,b}$; $T_{3,a}$, $T_{3,b}$) from the temperature sensors of each of the planes. In the embodiment of FIG. 3B, the TCO compensation circuit 2151 can be placed on the control die 311 or alternately on memory die 301.

In the embodiment of FIG. 21, each plane has two temperature sensing circuits, such as 2101 and 2103 for Plane 0 2100, but other embodiments can have more temperature sensors or only a single sensor per plane. For multiple sensors, an average of the temperature values could be determined and used by the TCO compensation circuit 2151. The temperature sensing circuits could be, for example, thermistor-based temperature sensing circuits or other type of temperature sensing circuit. Depending on the embodiment the temperature sensors for each plane can be on the edges of each array, close to or on the substrate, or within the array, such as on the substrate between blocks or even under the NAND strings. When the Icc level goes up on a plane during a write or other memory access operation, the generated heat in the plane will increase the local temperature and the sensing circuitry would be able to sense and provide a feedback to the TCO compensation circuit 2151. Bias levels used for the access operation can then be compensated during that operation to reduce subsequent peaks.

Non-volatile memory systems often already include a temperature sensing circuit and temperature compensation circuitry. However, this will be for measuring the ambient temperature at which the device is operating and for the device as a whole, rather than individually monitoring the temperature of each plane, independently determining the temperature changes of each plane relative to the ambient temperature in response to an operation, and then, during that operation, independently modifying one or more of the bias conditions of each plane. Depending on the embodiment, the temperature coefficients used for the bias levels can be the same as used when compensating for the ambient temperature, such as determined as part of device characterization and stored in the registers of storage 366, but now independently used for each plane based on that plane's temperature.

Figure 22:
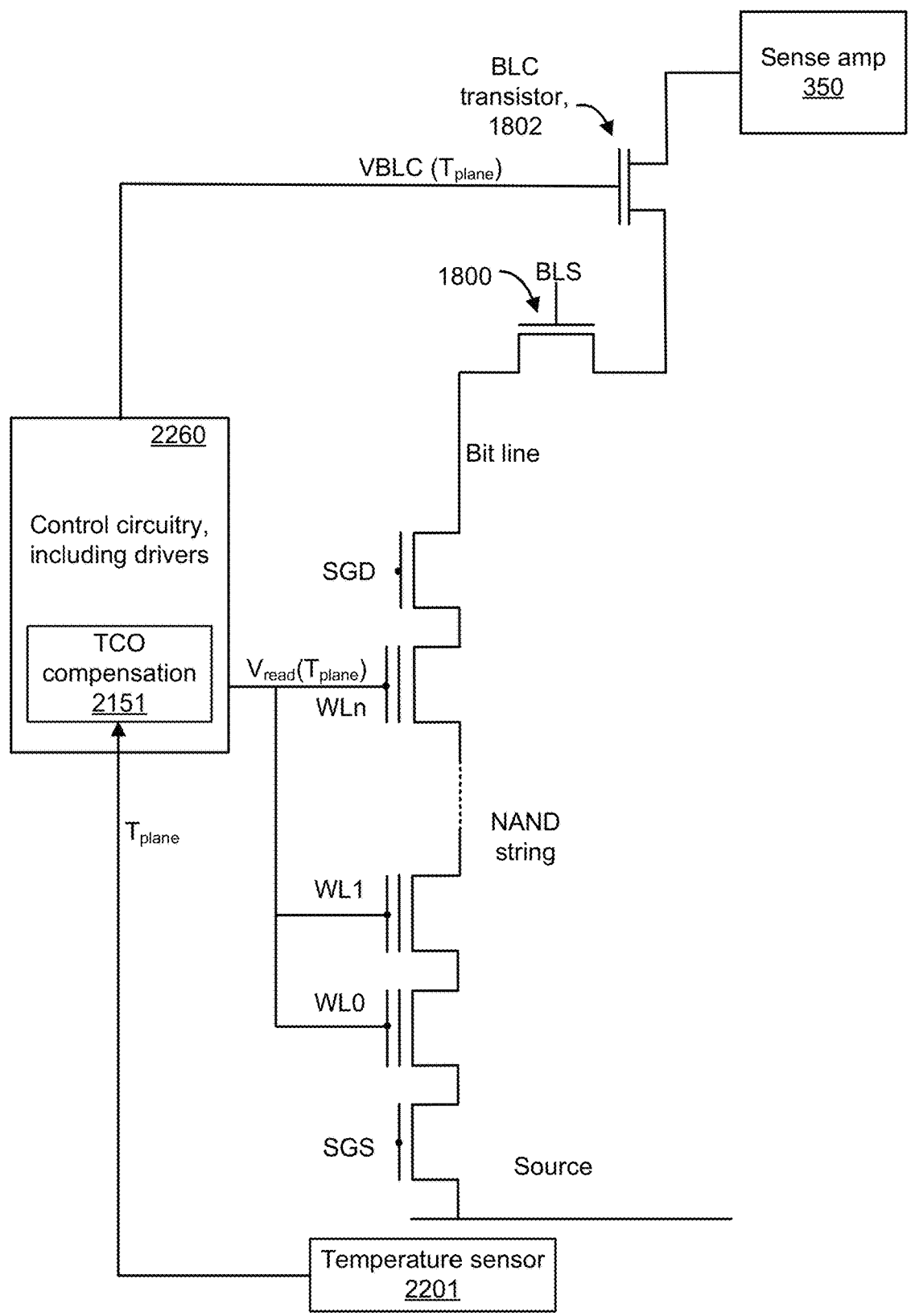
FIG. 22 is a schematic representation of some of the elements involved in the use of temperature sensing of a memory plane and using the temperature to modify the bias conditions during an ongoing memory operation.

FIG. 22 is a schematic representation of some of the elements involved in the use of temperature sensing of a memory plane and using the temperature to modify the bias conditions during an ongoing memory operation. A NAND string of memory cells is schematically represented as a set of series connected memory cells connected along word lines between a bit line through a drain side select gate SGD and a source lines through a source side select gate SGS. On the drain side, the bit line is connected to a sense amplifier 350, such as the embodiment of FIG. 18, through a bit line select switch transistor BLS 1800 and a bit line clamp transistor 1802. The NAND string is part of a block of a plane of the memory die that includes one or more temperature sensor circuits, such as temperature sensor 2201, that monitor the temperature of the plane during a memory access operation, such as a read, write, or erase operation. Relative to FIG. 21, the NAND string could be on any of the four planes and the temperature sensor 2201 can correspond to one of the planes temperature sensor circuits. The temperature value $T_{plane}$ from the temperature sensor 2201 is received by the TCO compensation circuit 2151, that is part of the control circuitry for the memory die, that can correspond to system control logic 360, column control circuitry 310, and row control circuitry 320 and include the driver circuitry for the rows and columns. Based on the temperature coefficients and the plane temperature $T_{plane}$, the drivers can adjust one or more of the bias levels for the plane during the course of the memory operation. Examples include the read pass voltage for unselected word lines Vread and bit line claim voltage VBLC, as shown in FIG. 22, as well as other bias levels such as the unselected word line program voltage Vpass.

Figure 23:
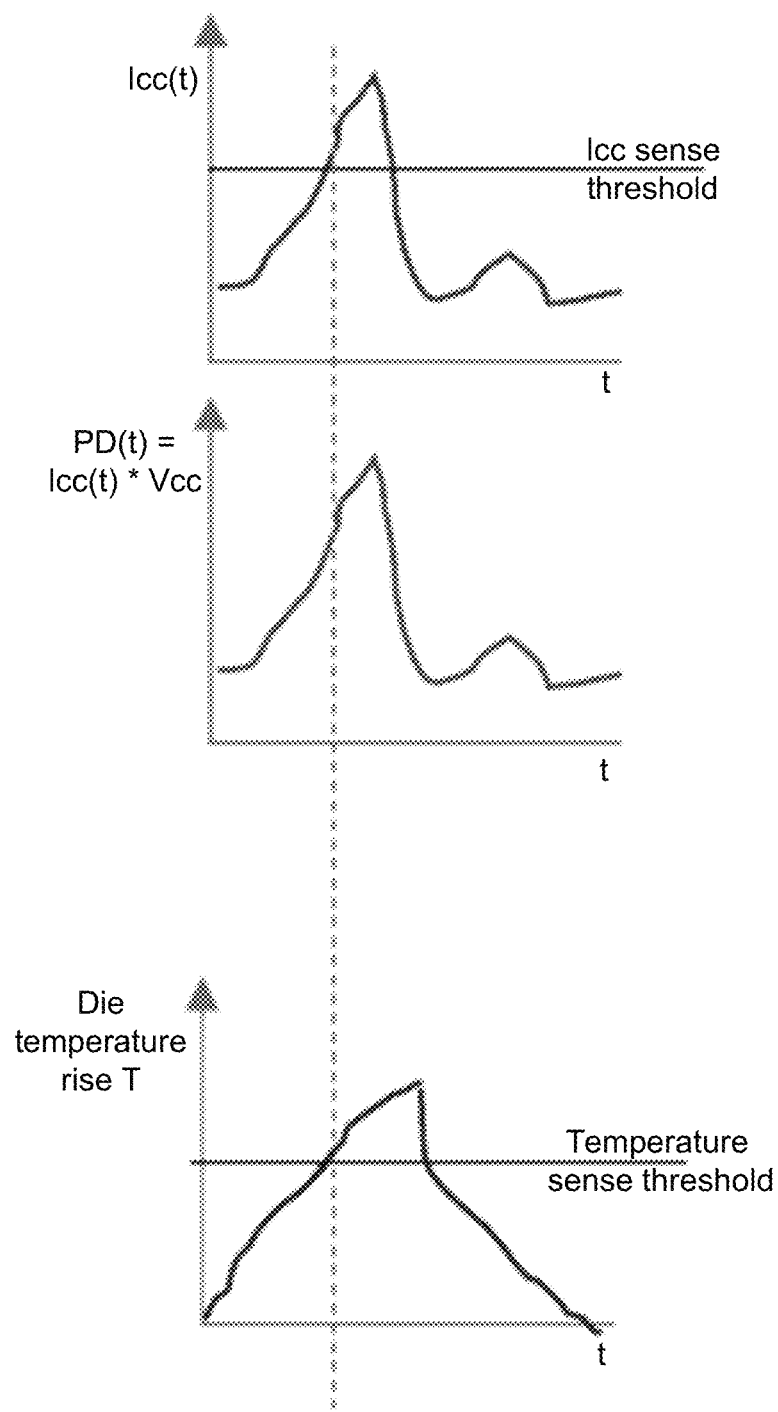
FIG. 23 illustrates the relationship between the current Icc, power consumption of the die, and die temperature.

FIG. 23 illustrates the relationship between the current Icc, power consumption of the die, and die temperature. At top, FIG. 23 illustrates the current Icc(t) as a function of time, where this can correspond to a peak within an interval of the waveform of FIG. 19 or 20. The power consumption of a plane PD(t) as a function of time over the same interval will be Icc(t)*Vcc, as illustrated at center in FIG. 23 and which closely follows the Icc(t) waveform. If the Icc(t) level exceeds a threshold, as marked at the Icc sense threshold on the top waveform, the bias levels can be altered to lower the Icc level later in the memory operation. Rather than monitoring Icc of a plane directly, the temperature of the plane within the memory die is monitored and used alter the bias levels during a memory operation, where, as shown in the bottom waveform of FIG. 23. As seen in FIG. 23, the die temperature rise closely mirrors the Icc level.

Figure 24:
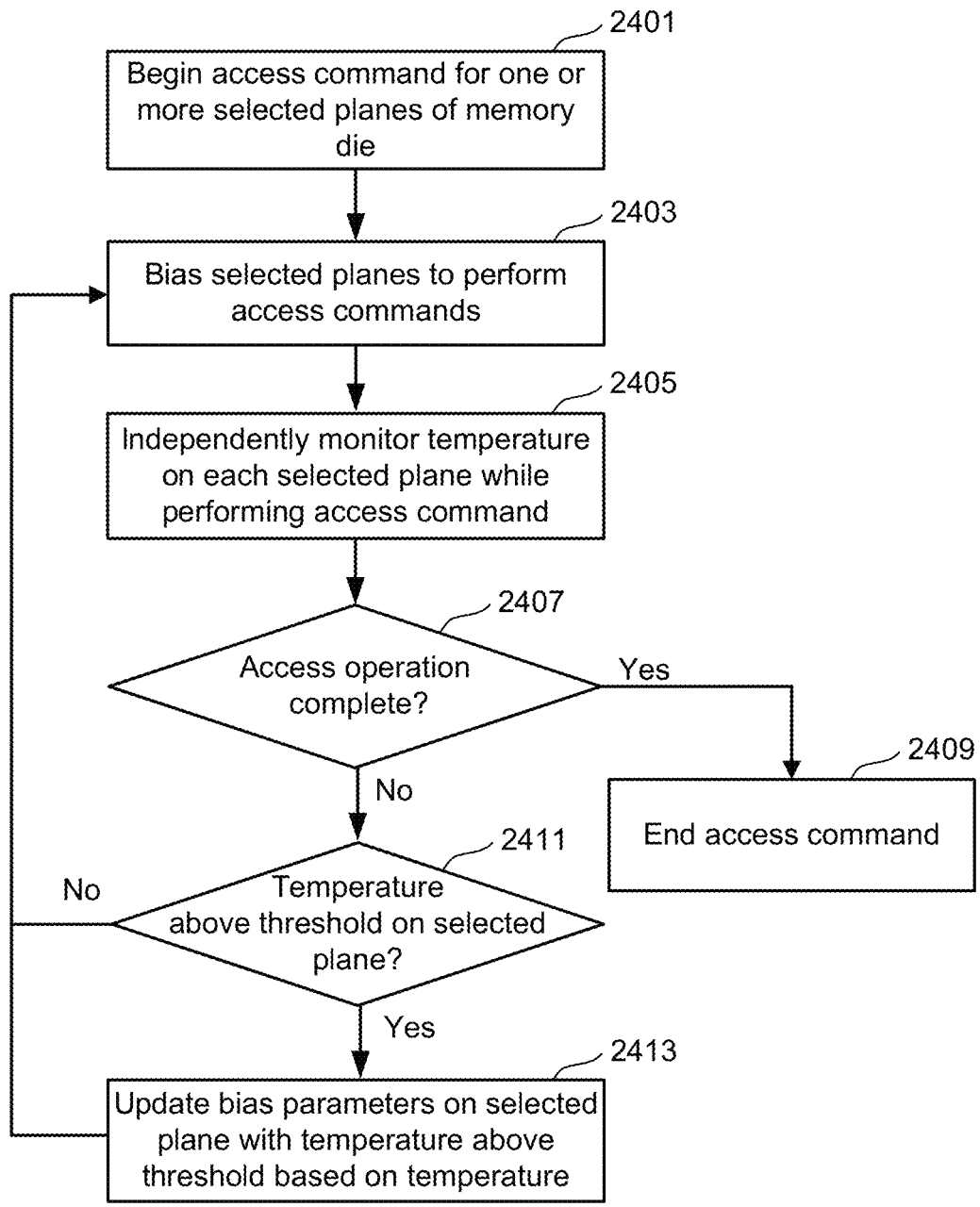
FIG. 24 is a flowchart for an embodiment for sensing the temperature of a memory plane during a memory access operation and updating bias voltages during the ongoing operation.

FIG. 24 is a flowchart for an embodiment for sensing the temperature of a memory plane during a memory access operation and updating bias voltages, such as bit line and word line bias voltages, during the ongoing operation. Staring at step 2401, a command for accessing one or more planes of a memory die, such as read, write, or erase commands, are begun. The commands can include both commands originating from a host 120 or commands originating on the memory controller 102, such as housekeeping operations like wear levelling or data scrub. The operations are then executed by the control circuitry on the memory die 300 for the embodiment of FIG. 3A or control die 311 for the embodiment of FIG. 3B on the planes of memory array 302.

At step 2403 the bias level voltages for the memory operation are applied to a selected memory plane are applied, such as being applied by the array drivers 324, driver circuit 314, and sense amps 330, which in FIG. 22 are schematically represented in the control circuitry, including drivers, 2260. The specifics of the bias levels will depend on the operation, but can include voltage as VBLC, Vread, and Vpass, for example, which can include voltages generated by charge pumps and regulators in the power control block 364. At the beginning of the operation, these bias levels may already have some temperature compensation based on the ambient temperature, but not reflecting any Icc increase on a plane that will be a consequence of the access operation begun at step 2401. While the memory operation is ongoing, the temperature on each of the planes is independently monitored for temperature change due to the operation at step 2405. For example, for Plane 0 2100 of FIG. 21 this would be based on the temperature values $T_{0,a}$ and $T_{0,b}$ from the distributed temperature sensing circuits 2103 and 2101 and similarly for the other planes that are received at the TCO compensation circuit 2151. The monitoring of the temperature values can continue as long as a memory operation in a plane is ongoing.

Step 2407 monitors whether a memory access operation in a plane is complete. For example, as discussed with respect to FIG. 8, in a write operation this would be based on the verify operations of each programming loop to determine whether the memory cells have, within an acceptable number of failed bits, passed the verify or that the write has failed. If complete, the access command for a plane ends at step 2409. At step 2411 the ongoing temperature monitoring at step 2405 can be checked to see whether the temperature associated with the plane has exceeded a threshold value, as described with respect to FIG. 23. If not, the flow loops back to continue the operation at 2403 while continuing to monitor the temperature on the die. If the temperature change on the plane has exceeded the threshold value at step 2411, the bias condition parameter values are correspondingly updated at step 2413 before looping back. For example, in the write operation of FIG. 20, bias levels such as VBLC or Vpass could be updated for later program loops based on the temperature changes due to earlier loops.

One embodiment includes a non-volatile memory system, comprising a control circuit configured to connect to a first plane of non-volatile memory cells formed on a first die, the first die including one or more first temperature sensors each configured to provide a corresponding temperature value measured for the first plane during an access operation of the memory cells of the first plane. The control circuit configured to: perform a first memory operation accessing the memory cells of the first plane; while performing the first memory operation, receive the temperature values corresponding to the first temperature sensors; while performing the first memory operation, determine an amount by which the received temperature values corresponding to the first temperature sensor has changed; and alter, during the first memory operation, one or more bias conditions for performing the first memory operation based on the amount by which the received temperature values corresponding to the first temperature sensor has changed while performing the first memory operation.

One embodiment includes a method comprising: independently monitoring a temperature for each of a plurality of planes of non-volatile memory cells on a die; and performing memory operations on the planes while independently monitoring the temperature of each of the planes. Each of the memory operations on a plane comprises: applying a plurality of bias voltages to the plane during a duration of the memory operation; determining a temperature change of the plane in response to applying the plurality of bias voltages during a first interval of the duration; and changing one or more of the applied voltages conditions during a second interval of the duration based on the determined temperature change, the second interval being subsequent to the first interval.

One embodiment includes a non-volatile memory system, comprising a die and one or more control circuits. The die includes: a plurality of planes of non-volatile memory cells; and a plurality of temperature sensor circuits, including one or more temperature sensors associated with each of the planes and configured to independently measure the temperature of the corresponding plane. The one or more control circuits are connected to the planes and to the temperature sensors. The one or more control circuits are configured to: independently monitor a temperature for each of a plurality of planes of non-volatile memory cells on a die; and perform memory operations on the planes while independently monitoring the temperature of each of the planes. To perform each of the memory operations on a plane, the one or more control circuits are configured to: apply a plurality of bias voltages to the plane during a duration of the memory operation; determine a temperature change of the plane in response to applying the plurality of bias voltages during a first interval of the duration; and change one or more of the applied voltages conditions during a second interval of the duration based on the determined temperature change, the second interval being subsequent to the first interval.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:
a control circuit configured to connect to a first plane of non-volatile memory cells formed on a first die, the first die including one or more temperature sensors, including a first temperature sensor, each configured to provide a corresponding temperature value measured for the first plane during an access operation of the memory cells of the first plane, the control circuit configured to:
 perform a first memory operation accessing the memory cells of the first plane;
 while performing the first memory operation, receive the temperature values corresponding to the first temperature sensor;
 while performing the first memory operation, determine an amount by which the received temperature values corresponding to the first temperature sensor has changed, including comparing the received temperature value corresponding to the first temperature sensor to a threshold value; and
 alter, during the first memory operation, one or more bias conditions for performing the first memory operation based on the amount by which the received temperature values corresponding to the first temperature sensor has changed while performing the first memory operation.

2. The non-volatile memory system of claim 1, wherein the control circuit is on a second die, separate from and bonded to the first die.

3. The non-volatile memory system of claim 1, wherein, while performing the first memory operation and subsequent to altering the one or more bias conditions, the control circuit is further configured to:
 receive the temperature value corresponding to the first temperature sensor;
 determine an amount by which the received temperature value corresponding to the first temperature sensor has changed since altering the one or more bias conditions; and
 further alter one or more of the bias conditions for performing the first memory operation based on the amount by which the received temperature value corresponding to the first temperature sensor has changed since altering the one or more bias conditions.

4. The non-volatile memory system of claim 1, wherein the first memory operation is a write operation.

5. The non-volatile memory system of claim 4, wherein the write operation comprises a sequence of a plurality of programming loops each including a programming pulse and subsequent verify, and wherein the control circuit is further configured to:
 determine the amount by which the received temperature value corresponding to the first temperature sensor has changed during a first one or more programming loops; and
 alter the one or more bias conditions for performing the first memory operation for a second one or more programming loops, the second programming loops being subsequent to the first programming loops.

6. The non-volatile memory system of claim 1, wherein the first memory operation is a read operation.

7. The non-volatile memory system of claim 1, wherein first die includes a plurality of temperature sensors each configured to provide a corresponding temperature value measured for the first plane during an access operation of the memory cells of the first plane.

8. The non-volatile memory system of claim 1, wherein the first die includes a plurality of planes, including the first plane, and a corresponding plurality of one or more temperature sensors, including the first temperature sensor, each corresponding to one of the planes and configured to provide corresponding temperature values for the corresponding plane independently of others of the planes.

9. The non-volatile memory system of claim 8, the non-volatile memory system further comprising the first die, including the plurality of planes and corresponding temperature sensors.

10. The non-volatile memory system of claim 9, wherein the first die further comprises the control circuit.

11. The non-volatile memory system of claim 9, wherein each of the planes comprise a plurality of blocks of memory cells having a NAND architecture in which NAND string are connected to bit lines, and
 wherein the one or more bias conditions altered based on the amount by which the received temperature values corresponding to the first temperature sensor has changed while performing the first memory operation include voltage levels for biasing the bit lines.

12. The non-volatile memory system of claim 9, wherein each of the planes comprise a plurality of blocks of memory cells having a NAND architecture in which the memory cells are connected along word lines,
   wherein first memory operation includes a sensing operation, and
   wherein the one or more bias conditions altered based on the amount by which the received temperature values corresponding to the first temperature sensor has changed while performing the first memory operation include a read bypass voltage for unselected word lines.

13. The non-volatile memory system of claim 9, wherein each of the planes comprise a plurality of blocks of memory cells having a NAND architecture in which the memory cells are connected along word lines,
   wherein first memory operation includes a programming operation, and
   wherein the one or more bias conditions altered based on the amount by which the received temperature values corresponding to the first temperature sensor has changed while performing the first memory operation include a program bypass voltage for unselected word lines.

14. The non-volatile memory system of claim 1, wherein, in response to determining the amount by which the received temperature values corresponding to the first temperature sensor has changed is an increase in the received temperature values, one or more of the altered biased conditions is changed to a lower voltage level.

15. A method, comprising:
   independently monitoring a temperature for each of a plurality of planes of non-volatile memory cells on a die; and
   performing memory operations on the planes while independently monitoring the temperature of each of the planes, each of the memory operations on a plane comprising:
      applying a plurality of bias voltages to the plane during a duration of the memory operation;
      determining a temperature change of the plane in response to applying the plurality of bias voltages during a first interval of the duration; and
      changing one or more of the applied voltages conditions during a second interval of the duration based on the determined temperature change, the second interval being subsequent to the first interval.

16. The method of claim 15, wherein the memory operations include a write operation on a first plane, the write operation comprising:
   a sequence of a plurality of programming loops, each programming loop comprising applying a programming pulse and a subsequent program verify,
   wherein the first interval is during a first one or more of the programming loops, and
   wherein the second interval is during a second one or more of the programming loops, the second programming loops being subsequent to the first programming loops.

17. The method of claim 15, wherein each of the planes comprise a plurality of blocks of memory cells having a NAND architecture in which NAND string are connected to bit lines, and
   wherein the applied bias voltages include voltage levels for biasing the bit lines.

18. A non-volatile memory system, comprising:
   a die, comprising:
      a plurality of planes of non-volatile memory cells; and
      a plurality of temperature sensor circuits, including one or more temperature sensors associated with each of the planes and configured to independently measure the temperature of the corresponding plane; and
   one or more control circuits connected to the planes and to the temperature sensors, the one or more control circuits configured to:
      independently monitor a temperature for each of a plurality of planes of non-volatile memory cells on a die; and
      perform memory operations on the planes while independently monitoring the temperature of each of the planes, where, to perform each of the memory operations on a plane, the one or more control circuits are configured to:
         apply a plurality of bias voltages to the plane during a duration of the memory operation;
         determine a temperature change of the plane in response to applying the plurality of bias voltages during a first interval of the duration; and
         change one or more of the applied voltages conditions during a second interval of the duration based on the determined temperature change, the second interval being subsequent to the first interval.

19. The non-volatile memory system of claim 18, wherein the memory operations include a write operation on a first plane, the write operation comprising:
   a sequence of a plurality of programming loops, each programming loop comprising applying a programming pulse and a subsequent program verify,
   wherein the first interval is during a first one or more of the programming loops, and
   wherein the second interval is during a second one or more of the programming loops, the second programming loops being subsequent to the first programming loops.

20. The method of claim 15, wherein each of the planes comprise a plurality of blocks of memory cells having a NAND architecture in which NAND string are connected to bit lines, and
   wherein the applied bias voltages include voltage levels for biasing the bit lines.

* * * * *